(12) United States Patent
Takahashi et al.

(10) Patent No.: US 12,481,218 B2
(45) Date of Patent: *Nov. 25, 2025

(54) TREATMENT LIQUID, METHOD FOR WASHING SUBSTRATE, AND METHOD FOR REMOVING RESIST

(71) Applicant: FUJIFILM Corporation, Tokyo (JP)

(72) Inventors: Tomonori Takahashi, Haibara-gun (JP); Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/400,807

(22) Filed: Dec. 29, 2023

(65) Prior Publication Data

US 2024/0134284 A1 Apr. 25, 2024
US 2024/0231237 A9 Jul. 11, 2024

Related U.S. Application Data

(63) Continuation of application No. 17/738,699, filed on May 6, 2022, now Pat. No. 11,899,369, which is a
(Continued)

(30) Foreign Application Priority Data

Jun. 3, 2016 (JP) .................................. 2016-112011

(51) Int. Cl.
 *G03F 7/42* (2006.01)
 *C11D 3/00* (2006.01)
 (Continued)

(52) U.S. Cl.
 CPC ............ *G03F 7/425* (2013.01); *C11D 3/0073* (2013.01); *C11D 7/04* (2013.01); *C11D 7/20* (2013.01);
 (Continued)

(58) Field of Classification Search
 CPC .............................. C03F 7/426; C11D 9/0073
 See application file for complete search history.

(56) References Cited

U.S. PATENT DOCUMENTS

5,759,973 A * 6/1998 Honda .................... G03F 7/425
  134/2
5,817,610 A * 10/1998 Honda .............. H01L 21/02071
  510/176
(Continued)

FOREIGN PATENT DOCUMENTS

JP H8-80996 A 3/1996
JP 2001-261312 A 9/2001
(Continued)

OTHER PUBLICATIONS

Office Action dated Mar. 26, 2024 in Japanese Application No. 2022-127615.
(Continued)

*Primary Examiner* — Mark Eashoo
*Assistant Examiner* — M. Reza Asdjodi
(74) *Attorney, Agent, or Firm* — Sughrue Mion, PLLC

(57) ABSTRACT

A treatment liquid for a semiconductor device includes an alkanolamine; a hydroxylamine; an organic solvent; Ca; Fe; and Na, wherein the content of the alkanolamine in the treatment liquid is 0.1% to 5% by mass, the content of the hydroxylamine in the treatment liquid is 0.1% to 30% by mass, and each of the mass ratio of Ca, Fe, and Na with respect to the content of the alkanolamine and the hydroxylamine in the treatment liquid is $10^{-12}$ to $10^{-4}$.

17 Claims, 1 Drawing Sheet

Related U.S. Application Data continuation of application No. 16/190,494, filed on Nov. 14, 2018, now Pat. No. 11,397,383, which is a continuation of application No. PCT/JP2017/017824, filed on May 11, 2017.

(51) Int. Cl.

| | | |
|---|---|---|
| C11D 7/04 | (2006.01) | |
| C11D 7/20 | (2006.01) | |
| C11D 7/26 | (2006.01) | |
| C11D 7/32 | (2006.01) | |
| C11D 7/34 | (2006.01) | |
| C11D 7/50 | (2006.01) | |
| H01L 21/02 | (2006.01) | |

(52) U.S. Cl.
CPC ............ *C11D 7/261* (2013.01); *C11D 7/3209* (2013.01); *C11D 7/3218* (2013.01); *C11D 7/3227* (2013.01); *C11D 7/3281* (2013.01); *C11D 7/34* (2013.01); *C11D 7/5004* (2013.01); *C11D 7/5009* (2013.01); *C11D 7/5022* (2013.01); *G03F 7/423* (2013.01); *G03F 7/426* (2013.01); *H01L 21/02063* (2013.01); *H01L 21/02068* (2013.01); *C11D 2111/22* (2024.01)

(56) References Cited

U.S. PATENT DOCUMENTS

| | | | | |
|---|---|---|---|---|
| 6,020,292 | A * | 2/2000 | Honda | G03F 7/425 510/264 |
| 6,465,403 | B1 * | 10/2002 | Skee | C11D 7/261 257/E21.228 |
| 6,585,825 | B1 * | 7/2003 | Skee | C11D 3/33 257/E21.228 |
| 6,599,370 | B2 * | 7/2003 | Skee | C11D 7/3209 257/E21.255 |
| 7,671,001 | B2 * | 3/2010 | Skee | C11D 7/02 510/175 |
| 2001/0034312 | A1 * | 10/2001 | Imai | C23C 22/68 510/175 |
| 2002/0130298 | A1 * | 9/2002 | Ichiki | G03F 7/425 257/E21.255 |
| 2004/0081922 | A1 * | 4/2004 | Ikemoto | G03F 7/425 510/176 |
| 2004/0220066 | A1 * | 11/2004 | Rutter, Jr. | G03F 7/425 510/175 |
| 2005/0020463 | A1 * | 1/2005 | Ikemoto | C11D 11/0047 510/175 |
| 2005/0170981 | A1 * | 8/2005 | Mun | C11D 3/2055 510/424 |
| 2006/0030158 | A1 * | 2/2006 | Carter | C09K 3/1463 438/692 |
| 2007/0060490 | A1 * | 3/2007 | Skee | C11D 7/32 510/175 |
| 2007/0099810 | A1 * | 5/2007 | Matsunaga | C11D 7/06 510/421 |
| 2010/0167547 | A1 | 7/2010 | Kamimura | |
| 2010/0167972 | A1 * | 7/2010 | Kawase | C11D 3/2075 510/175 |
| 2010/0248486 | A1 | 9/2010 | Nakamura | |
| 2010/0294306 | A1 | 11/2010 | Mochizuki et al. | |
| 2011/0092074 | A1 | 4/2011 | Mayer et al. | |
| 2013/0174868 | A1 | 7/2013 | Muraoka et al. | |
| 2014/0087313 | A1 | 3/2014 | Ueno et al. | |
| 2014/0290093 | A1 * | 10/2014 | Jung | H01L 21/67034 34/570 |
| 2015/0111804 | A1 | 4/2015 | Dory | |
| 2015/0114429 | A1 * | 4/2015 | Jenq | C11D 7/267 134/2 |
| 2015/0267112 | A1 * | 9/2015 | Dory | H01L 21/32134 252/79.1 |
| 2016/0252819 | A1 * | 9/2016 | Sugishima | G03F 7/426 430/258 |
| 2016/0254139 | A1 * | 9/2016 | Kamimura | B08B 3/10 510/176 |
| 2016/0272924 | A1 * | 9/2016 | Kajikawa | C11D 7/265 |
| 2017/0183607 | A1 | 6/2017 | Shimada | |
| 2017/0240850 | A1 | 8/2017 | Oie et al. | |
| 2019/0033718 | A1 * | 1/2019 | Kamimura | G03F 7/422 |
| 2019/0071623 | A1 * | 3/2019 | Kamimura | H01L 21/308 |
| 2019/0079409 | A1 * | 3/2019 | Takahashi | C11D 7/5009 |
| 2022/0260919 | A1 * | 8/2022 | Takahashi | H01L 21/02063 |
| 2024/0134284 | A1 * | 4/2024 | Takahashi | C11D 7/3281 |

FOREIGN PATENT DOCUMENTS

| | | |
|---|---|---|
| JP | 2002-270566 A | 9/2002 |
| JP | 2003-289060 A | 10/2003 |
| JP | 2005-215627 A | 8/2005 |
| JP | 2005-260213 A | 9/2005 |
| JP | 2006-173566 A | 6/2006 |
| JP | 2007-109744 A | 4/2007 |
| JP | 2007-119783 A | 5/2007 |
| JP | 2007-134690 A | 5/2007 |
| JP | 2008-509554 A | 3/2008 |
| JP | 2008-135576 A | 6/2008 |
| JP | 2009-4759 A | 1/2009 |
| JP | 2009-105299 A | 5/2009 |
| JP | 2009-141310 A | 6/2009 |
| JP | 2009-141311 A | 6/2009 |
| JP | 2010-267818 A | 11/2010 |
| JP | 2012-44118 A | 3/2012 |
| JP | 2013-061426 A | 4/2013 |
| JP | 2013-222947 A | 10/2013 |
| JP | 2014-67752 A | 4/2014 |
| JP | 2015-118125 A | 6/2015 |
| JP | 2015-524165 A | 8/2015 |
| JP | 2015-165561 A | 9/2015 |
| JP | 2015-200830 A | 11/2015 |
| JP | 2015-201484 A | 11/2015 |
| JP | 6808730 B2 | 1/2021 |
| WO | 2006/023061 A1 | 3/2006 |
| WO | 2008/023753 A1 | 2/2008 |
| WO | 2008/023754 A1 | 2/2008 |
| WO | 2009/072529 A1 | 6/2009 |
| WO | 2009/073588 A1 | 6/2009 |
| WO | 2009/073589 A1 | 6/2009 |
| WO | 2010/119753 A1 | 10/2010 |
| WO | 2012/043496 A1 | 4/2012 |
| WO | 2015/068823 A1 | 5/2015 |
| WO | 2015/089023 A1 | 6/2015 |
| WO | 2015/156171 A1 | 10/2015 |
| WO | 2016/076033 A1 | 5/2016 |

OTHER PUBLICATIONS

Communication dated Aug. 18, 2020, from the Japanese Patent Office in Application No. 2018-520755.
Communication dated Nov. 19, 2019, from the Japanese Patent Office in Application No. 2018-520755.
Office Action dated May 17, 2022 from the Japanese Patent Office in corresponding Japanese Application No. 2020-188735.
International Preliminary Report on Patentability with translation of Written Opinion dated Dec. 4, 2018, issued by the International Searching Authority in application No. PCT/JP2017/017824.
International Search Report dated Aug. 8, 2017, issued by the International Searching Authority in application No. PCT/JP2017/017824.
Japanese Office Action dated Sep. 19, 2023 in Japanese Application No. 2022-127615.
Notice of Reasons for Refusal dated Mar. 10, 2020 from the Japanese Patent Office in application No. 2018-520755.
Office Action dated Nov. 24, 2021 from the Japanese Patent Office in JP Application No. 2020-188735.

(56) References Cited

OTHER PUBLICATIONS

Written Opinion dated Aug. 8, 2017, issued by the International Searching Authority in application No. PCT/JP2017/017824.

* cited by examiner

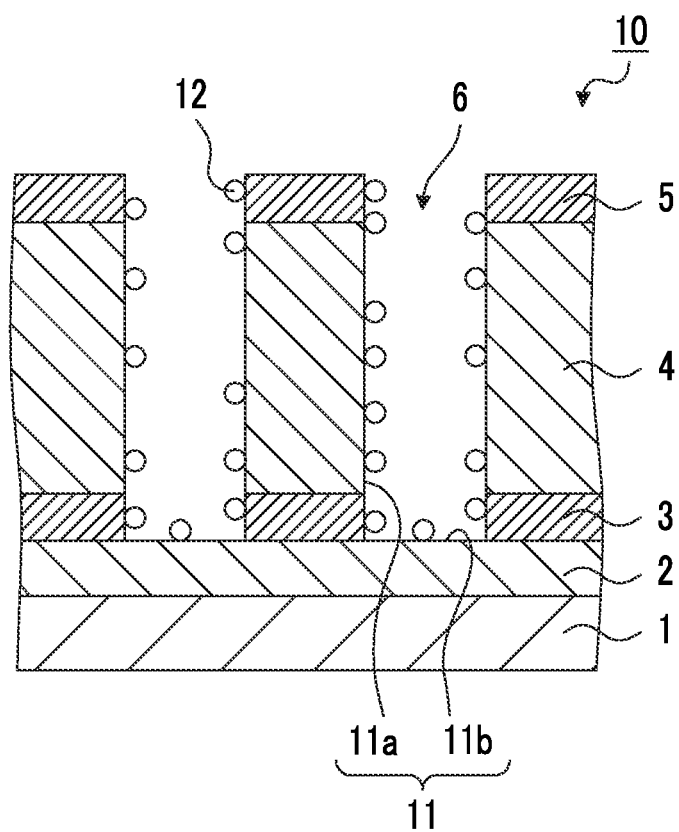

TREATMENT LIQUID, METHOD FOR WASHING SUBSTRATE, AND METHOD FOR REMOVING RESIST

CROSS-REFERENCE TO RELATED APPLICATIONS

This application is a Continuation of U.S. application Ser. No. 17/738,699 filed May 6, 2022, which is a Continuation of U.S. application Ser. No. 16/190,494 filed on Nov. 14, 2018, now issued as U.S. Pat. No. 11,397,383 on Jul. 26, 2022, which is a Continuation of PCT International Application No. PCT/JP2017/017824 filed on May 11, 2017, which claims priority under 35 U.S.C § 119(a) to Japanese Patent Application No. 2016-112011 filed on Jun. 3, 2016. Each of the above application(s) is hereby expressly incorporated by reference, in its entirety, into the present application.

BACKGROUND OF THE INVENTION

1. Field of the Invention

The present invention relates to a treatment liquid for a semiconductor device, a method for washing a substrate, and a method for removing a resist.

2. Description of the Related Art

A semiconductor device such as a charge-coupled device (CCD) and a memory is manufactured by forming fine electronic circuit patterns on a substrate using a photolithographic technique. Specifically, the semiconductor device is manufactured by forming a resist film on a laminate having a metal layer that serves as a wiring material, an etching stop film, and an interlayer insulating film on a substrate, followed by carrying out a photolithography step and a dry etching step (for example, a plasma etching treatment).

Furthermore, a dry ashing step (for example, a plasma ashing treatment) for peeling the resist film is performed, as desired.

In some cases, residues of the resist film adhere onto the metal layer and/or the interlayer insulating film, or the like of a substrate which has been subjected to the dry ashing step. Accordingly, removal of the residues of the resist film is generally performed.

For example, in JP2015-200830A, a photolithographic peeling liquid which contains a hydrofluoric acid, a specific basic compound, water, and a specific organic solvent, and optionally contains a corrosion inhibitor is disclosed (claim 1, paragraphs 0040 and the like).

SUMMARY OF THE INVENTION

A treatment liquid used during the manufacture of a semiconductor device is used for, for example, a treatment for removing a resist film and a treatment for removing residues adhering onto a metal layer in some cases, in addition to the treatment for removing residues of the resist film as described above.

During such various removing treatments, the treatment liquid may be in contact with the metal layers such as a wiring material, a plug material, or the like provided on the substrate in some cases. In this case, the treatment liquid in contact with the metal layer ultimately corrodes the metal layer, and as a result, desired performance for the semiconductor device is not obtained in some cases.

With regard to such a problem, the present inventors have manufactured a treatment liquid for a semiconductor device with reference to the composition of the photolithographic peeling liquid described in JP2015-200830A, and have tried to remove a resist (at least one of a resist film or a residue thereof) using the treatment liquid. Thus, the present inventors have found that the resist can be removed, the anticorrosion properties of a metal layer is good, but particulate defects (foreign matters) adhere to members constituting a semiconductor device, such as a metal layer.

It is considered that such particulate defects are derived from the components included in the treatment liquid.

Therefore, an object of the present invention is to provide a treatment liquid which is capable of reducing generation of defects, and has excellent anticorrosion properties to a metal layer included in a semiconductor device and excellent removing capability for a resist used during the manufacture of a semiconductor device.

In addition, another object of the present invention is to provide a method for washing a substrate and a method for removing a resist.

The present inventors have conducted extensive studies on the objects, and as a result, they have found that by adjusting each of the mass ratio of the Ca, the mass ratio of the Fe, and the mass ratio of the Na to the organic alkali compound to be within predetermined ranges, desired effects are obtained, thereby leading to the present invention.

That is, the present inventors have found that the objects can be accomplished by the following configurations.

[1] A treatment liquid for a semiconductor device, comprising:
an organic alkali compound;
a corrosion inhibitor;
an organic solvent;
Ca;
Fe; and
Na,
in which each of the mass ratio of Ca, Fe, and Na with respect to the organic alkali compound in the treatment liquid is $10^{-12}$ to $10^{-4}$.

[2] The treatment liquid as described in [1],
in which each of the mass ratio of Ca, Fe, and Na with respect to the corrosion inhibitor in the treatment liquid is $10^{-12}$ to $10^{-4}$.

[3] The treatment liquid as described in [1] or [2],
in which each of the content of Ca, Fe, and Na with respect to the total mass of the treatment liquid is 0.1 ppt by mass to 10 ppb by mass.

[4] The treatment liquid as described in any one of [1] to [3], further comprising water,
in which the content of the water with respect to the total mass of the treatment liquid is 20% to 98% by mass, and
the content of the organic solvent with respect to the total mass of the treatment liquid is 1% to 40% by mass.

[5] The treatment liquid as described in any one of [1] to [3], further comprising water,
in which the content of the water with respect to the total mass of the treatment liquid is 1% to 40% by mass, and
the content of the organic solvent with respect to the total mass of the treatment liquid is 20% to 98% by mass.

[6] The treatment liquid as described in any one of [1] to [5], further comprising halogen acid.

[7] The treatment liquid as described in any one of [1] to [6],
in which the pH of the treatment liquid is more than 9 and less than 15.

[8] The treatment liquid as described in any one of [1] to [7],
   in which in a case where the viscosity of the treatment liquid at room temperature is measured using a rotational viscometer, the ratio of the viscosity of the treatment liquid at a rotation speed of 100 rpm with respect to the viscosity of the treatment liquid at a rotation speed of 1,000 rpm is 1 to 20.

[9] The treatment liquid as described in any one of [1] to [8],
   in which the organic alkali compound includes at least one compound selected from the group consisting of a compound represented by Formula (1) which will be described later and a compound represented by Formula (2) which will be described later,
   in Formula (1) which will be described later, $R^{4,4}$ to $R^{4,4}$ each independently represent an alkyl group having 1 to 6 carbon atoms, a hydroxyalkyl group having 1 to 6 carbon atoms, a benzyl group, or an aryl group, and $X^-$ represents a counter anion, and
   in Formula (2) which will be described later, $R^1$ and $R^2$ each independently represent a hydrogen atom, a methyl group, an ethyl group, or a hydroxyethyl group, and $R^3$'s each independently represent a hydrogen atom or a hydroxyethyl group, provided that in Formula (2) which will be described later, at least one alkanol group is included.

[10] The treatment liquid as described in any one of [1] to [9],
   in which the semiconductor device has a substrate including a metal layer containing Co, and
   the treatment liquid is used for the treatment to the metal layer.

[11] The treatment liquid as described in any one of [1] to [10],
   in which a resist film is formed during the manufacture of the semiconductor device, and
   the treatment liquid is used for the removal of a resist which is at least one of the resist film or a residue of the resist film.

[12] The treatment liquid as described in any one of [1] to [11],
   in which the corrosion inhibitor includes at least one compound selected from the group consisting of a compound represented by Formula (A) which will be described later, a compound represented by Formula (B) which will be described later, a compound represented by Formula (C) which will be described later, and a substituted or unsubstituted tetrazole,
   in Formula (A) which will be described later, $R^{1A}$ to $R^{5A}$ each independently represent a hydrogen atom, a substituted or unsubstituted hydrocarbon group, a hydroxyl group, a carboxyl group, or a substituted or unsubstituted amino group, provided that at least one group selected from the group consisting of the hydroxyl group, the carboxyl group, and the substituted or unsubstituted amino group is included in the structure,
   in Formula (B) which will be described later, $R^{1B}$ to $R^{4B}$ each independently represent a hydrogen atom or a substituted or unsubstituted hydrocarbon group, and
   in Formula (C) which will be described later, $R^{1C}$, $R^{2C}$, and $R^N$ each independently represent a hydrogen atom or a substituted or unsubstituted hydrocarbon group, and $R^{1C}$ and $R^{2C}$ may be bonded to each other to form a ring.

[13] A method for washing a substrate, comprising a washing step B in which a substrate including a metal layer containing Co is washed using the treatment liquid described in any one of [1] to [12].

[14] The method for washing a substrate as described in [13], further comprising:
   a drainage recovering step C in which drainage of the treatment liquid used in the washing step B is recovered;
   a washing step D in which a newly prepared substrate including a metal layer containing Co is washed with the recovered drainage of the treatment liquid;
   a drainage recovering step E in which drainage of the treatment liquid used in the washing step D is recovered; and
   a step in which the washing step D and the drainage recovering step E are repeated.

[15] The method for washing a substrate as described in or [14], further comprising:
   a treatment liquid preparing step A in which the treatment liquid is prepared before the washing step B; and
   an ion removing step F in which Ca ions, Fe ions, and Na ions are removed from at least one of the organic alkali compound, the corrosion inhibitor, or the organic solvent before the treatment liquid preparing step A, or an ion removing step G in which Ca ions, Fe ions, and Na ions in the treatment liquid are removed before performing the washing step B and after the treatment liquid preparing step A.

[16] The method for washing a substrate as described in [15],
   in which the treatment liquid preparing step A is to prepare the treatment liquid using water, and
   the ion removing step F is to remove Ca ions, Fe ions, and Na ions from at least one of the organic alkali compound, the corrosion inhibitor, the organic solvent, or the water.

[17] The method for washing a substrate as described in any one of to [16], further comprising:
   a treatment liquid preparing step A in which the treatment liquid is prepared using water before the washing step B; and
   a neutralization step I in which the water is subjected to charge elimination before the treatment liquid preparing step A, or a neutralization step J in which the treatment liquid is subjected to charge elimination before performing the washing step B and after the treatment liquid preparing step A.

[18] A method for removing a resist, comprising removing a resist which is at least one of a resist film or a residue of the resist film using the treatment liquid as described in any one of [1] to [12].

As shown below, according to the present invention, it is possible to provide a treatment liquid which is capable of reducing generation of defects, and has excellent anticorrosion properties to a metal layer included in a semiconductor device and excellent removing capability for a resist used during the manufacture of a semiconductor device. In addition, according to the present invention, it is also possible to provide a method for washing a substrate and a method for removing a resist.

BRIEF DESCRIPTION OF THE DRAWING

FIG. 1 is a schematic cross-sectional view showing an example of a laminate which can be applied to the method for washing a substrate of the embodiment of the present invention.

DESCRIPTION OF THE PREFERRED EMBODIMENTS

Hereinbelow, the present invention will be described.

Furthermore, in the present invention, the numerical value ranges shown using "to" mean ranges including the numerical values indicated before and after "to" as the lower limit value and the upper limit value, respectively.

Moreover, in the present invention, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Furthermore, in the present invention, 1 Å (angstrom) corresponds to 0.1 nm.

In addition, in citations for a group (atomic group) in the present invention, in a case where the group (atomic group) is denoted without specifying whether it is substituted or unsubstituted, the group (atomic group) includes both a group (atomic group) having no substituent and a group (atomic group) having a substituent within a range not impairing the effects of the present invention. For example, a "hydrocarbon group" includes not only a hydrocarbon group having no substituent (unsubstituted hydrocarbon group) but also a hydrocarbon group having a substituent (substituted hydrocarbon group). This also applies to the respective compounds.

In addition, "radiation" in the present invention means, for example, a bright line spectrum of a mercury lamp, far ultraviolet rays typified by excimer laser, extreme ultraviolet rays (EUV light), X-rays, or electron beams. Further, the term "light" in the present invention means actinic rays or radiation. Unless otherwise indicated, the term "exposure" in the present invention includes not only exposure to a bright line spectrum of a mercury lamp, far ultraviolet rays typified by excimer laser, X-rays, EUV light, or the like but also exposure using lithography with particle beams such as electron beams and ion beams.

In addition, in the present invention, "(meth)acrylate" represents both or either of acrylate and methacrylate.

[Treatment Liquid]

The treatment liquid of the embodiment of the present invention is a treatment liquid for a semiconductor device, containing an organic alkali compound, a corrosion inhibitor, an organic solvent, Ca, Fe, and Na, in which each of the mass ratio of Ca, Fe, and Na with respect to the organic alkali compound in the treatment liquid is $10^{-12}$ to $10^{-4}$.

Hereinafter, the Ca atoms, Fe atoms, and Na atoms included in the treatment liquid of the embodiment of the present invention may be collectively referred to "specific metal elements" in some cases.

By the treatment liquid of the embodiment of the present invention, generation of defects can be reduced, the anticorrosion properties for a metal layer included in a semiconductor device is excellent, and the removing capability for a resist used during the manufacture of a semiconductor device is also excellent. Some of details of a reason therefor are not clarified yet, but the reason is presumed to be as follows.

The specific metal elements easily generate migration. Accordingly, in a case of using a treatment liquid containing the specific metal elements during the manufacture of a semiconductor device, failures (short-circuits and the like) semiconductor device caused by the specific metal elements may occur in some cases. Therefore, the present inventors have studied to suppress the failures of the semiconductor device, and they have thus found that by using a treatment liquid containing an organic alkali compound and a corrosion inhibitor, it is possible to not only suppress corrosion of the metal layer, but also form a salt from at least one of the organic alkali compound or the corrosion inhibitor with the specific metal elements, thereby suppress generation of migration.

However, according to the studies of the present inventors, it has been found that in a case where the amount of the specific metal elements with respect to the organic alkali compound in the treatment liquid is too large, the salts included in the treatment liquid and components derived therefrom become particulate defects, and the particulate defects adhere to the members constituting a semiconductor device and thus generate failures of the semiconductor device.

In addition, the present inventors have also found that in a case where the amount of the specific metal elements with respect to the organic alkali compound in the treatment liquid is too small, particulate defects are rather generated in the semiconductor device although a reason therefor is not clarified.

From the above, the present inventors have presumed that by adjusting the mass ratio of each of Ca, Fe, and Na with respect to the organic alkali compound to be within specific ranges, each of the above-mentioned effects is obtained.

Furthermore, it has also been found that since the treatment liquid of the embodiment of the present invention contains the organic solvent, a compatibility between the treatment liquid and a resist (particularly an organic resist) used during the manufacture of a semiconductor device is enhanced, and thus, the removing capability for the resist (particularly an organic resist) is also improved.

Hereinbelow, the components which are included or can be included in the treatment liquid of the embodiment of the present invention will be described.

<Organic Alkali Compound>

The treatment liquid of the embodiment of the present invention contains an organic alkali compound. Examples of the function of the organic alkali compound include improvement of removing capability of a resist and reduction in defects.

In the present invention, the organic alkali compound means an organic compound which exhibits alkalinity.

Examples of the organic alkali compound include a quaternary ammonium salt, an alkanolamine, an alkylhydroxylamine, and an alkylhydroxylamine salt, and from the viewpoint of further improving the reduction in removing capability of a resist and defects as described above, the quaternary ammonium salt and the alkanolamine are preferably used. Further, among those compounds, the quaternary ammonium salt can also function as a pH adjuster.

The quaternary ammonium salt is preferably a compound represented by Formula (1).

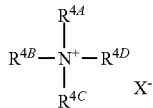

In Formula (1), $R^{4A}$ to $R^{4D}$ each independently represent an alkyl group having 1 to 6 carbon atoms, a hydroxyalkyl group having 1 to 6 carbon atoms, a benzyl group, or an aryl group, and $X^-$ represents a counter anion.

In Formula (1), $R^{4A}$ to $R^{4D}$ each independently represent an alkyl group having 1 to 6 carbon atoms (for example, a methyl group, an ethyl group, and a butyl group), a hydroxyalkyl group having 1 to 6 carbon atoms (for example, a hydroxymethyl group, a hydroxyethyl group, and a hydroxybutyl group), a benzyl group, or an aryl group (for example, a phenyl group, a naphthyl group, and a naphthalene group). Among those, the alkyl group, the hydroxyethyl group, and the benzyl group are preferable.

In Formula (1), $X^-$ represents a counter anion. The counter anion is not particularly limited, but examples thereof include various acid anions such as a carboxylic acid ion, a phosphoric acid ion, a sulfuric acid ion, a phosphonic acid ion, and a nitric acid ion, a hydroxide ion, and a halide ion (for example, a chloride ion, a fluoride ion, and a bromide ion).

Specific examples of the compound represented by Formula (1) include tetramethylammonium hydroxide, tetraethylammonium hydroxide, tetrapropylammonium hydroxide, tetrabutylammonium hydroxide, ethyltrimethylammonium hydroxide, trimethylhydroxyethylammonium hydroxide, methyltri(hydroxyethyl)ammonium hydroxide, tetra(hydroxyethyl)ammonium hydroxide, benzyltrimethylammonium hydroxide, tetrapentylammonium hydroxide, tetrahexylammonium hydroxide, tetraoctylammonium hydroxide, butyltrimethylammonium hydroxide, methyltriamylammonium hydroxide, dibutyldipentylammonium hydroxide, triethylphenylammonium hydroxide, trimethylbenzylammonium hydroxide, triethylbenzylammonium hydroxide, tribenzylmethylammonium hydroxide, tetrabenzylammonium hydroxide, trimethylcyclohexylammonium hydroxide, tributylcyclohexylammonium hydroxide, monohydroxyethyltrimethylammonium hydroxide, dihydroxyethyldimethylammonium hydroxide (dimethylbis(2-hydroxyethyl)ammonium hydroxide), trihydroxyethylmonomethylammonium hydroxide, monohydroxyethyltriethylammonium hydroxide, dihydroxyethyldiethylammonium hydroxide, trihydroxyethylmonoethylammonium hydroxide, monohydroxypropyltrimethylammonium hydroxide, dihydroxypropyldimethylammonium hydroxide, trihydroxypropylmonomethylammonium hydroxide, monohydroxypropyltriethylammonium hydroxide, dihydroxypropyldiethylammonium hydroxide, trihydroxypropylmonoethylammonium hydroxide, and choline (for example, cholinehydroxide).

Among those, tetramethylammonium hydroxide, tetraethylammonium hydroxide, tetrabutylammonium hydroxide, ethyltrimethylammonium hydroxide, dimethylbis(2-hydroxyethyl)ammonium hydroxide, benzyltrimethylammonium hydroxide, and cholinehydroxide are preferably used, and tetramethylammonium hydroxide and dimethylbis(2-hydroxyethyl)ammonium hydroxide are more preferably used.

The quaternary ammonium salt may be used singly or in combination of two or more kinds thereof.

The alkanolamine may be any one of a primary amine, a secondary amine, or a tertiary amine, and is preferably a monoamine, a diamine, or a triamine, and more preferably a monoamine. The alkanol group of the amine preferably has 1 to 5 carbon atoms.

The alkanolamine is preferably a compound represented by Formula (2).

$$R^1R^2\text{—}N\text{—}CH_2CH_2\text{—}O\text{—}R^3 \qquad \text{Formula (2):}$$

In Formula (2), $R^1$ and $R^2$ each independently represent a hydrogen atom, a methyl group, an ethyl group, or a hydroxyethyl group, and $R^3$'s each independently represent a hydrogen atom or a hydroxyethyl group, provided that in Formula (2), at least one alkanol group is included.

Specific examples of the alkanolamine include monoethanolamine, diethanolamine, triethanolamine, tertiary butyldiethanolamine, isopropanolamine, 2-amino-1-propanol, 3-amino-1-propanol, isobutanolamine, 2-amino-2-ethoxypropanol, and 2-amino-2-ethoxy-ethanol also known as diglycol amine.

The alkanolamine may be used singly or in combination of two or more kinds thereof.

The alkylhydroxylamine is not particularly limited, but examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

The salt of the alkylhydroxylamine is preferably an inorganic acid salt or organic acid salt of the alkylhydroxylamine as described above, more preferably a salt of an inorganic acid formed by the bonding of a non-metal such as Cl, S, N, and P with hydrogen, and still more preferably a salt of any one acid of hydrochloric acid, sulfuric acid, or nitric acid.

The alkylhydroxylamine and the alkylhydroxylamine salt may be used singly or in combination of two or more kinds thereof.

The content of the organic alkali compound in the treatment liquid is preferably 0.1% to 30% by mass, more preferably 0.5% to 10% by mass, and still more preferably 0.5% to 5% by mass, with respect to the total mass of the treatment liquid.

The organic alkali compound may be used singly or in combination of two or more kinds thereof. In a case where two or more kinds of the organic alkali compounds are used in combination, the total amount thereof is preferably within the above-mentioned range.

A high-purity grade of the organic alkali compound having reduced contents of Ca, Fe, and Na is preferably used, and the organic alkali compound which has been further purified is more preferably used.

In addition, the quaternary ammonium compound can be purified by a known method. By repeating filtering through a filter, in addition to the adsorption purification using silicon carbide described in WO2012/043496A, for example, purification can be performed.

<Corrosion Inhibitor>

The corrosion inhibitor has a function of solving the overetching of a metal layer (particularly, Co) which serves as wiring of a semiconductor device, or the like. The corrosion inhibitor may be referred to as an anticorrosion agent in some cases.

The corrosion inhibitor is not particularly limited, but examples thereof include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyltriazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazol-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, citric acid, ascorbic acid, thiourea, 1,1,3,3-tetramethylurea, urea, urea derivatives, uric acid, potassium ethylxanthate, glycine, dodecyl phosphonic acid, iminodiacetic acid, boric acid, malonic acid, succinic acid, nitrilotriacetic acid, sulfolane, 2,3,5-trimethylpyrazine, 2-ethyl-3,5-dimethyl pyrazine, quinoxaline, acetylpyrrole, pyridazine, histadine, pyrazine, (reduced) glutathione, cysteine, cystine, thiophene, mercaptopyridine N-oxide, thiamine HCl, tetraethyl thiuram disulfide, 2,5-dimercapto-1,3-thiadiazole-ascorbic acid, ascorbic acid, catechol, t-butyl catechol, phenol, and pyrogallol.

In addition, it is also preferable that the substituted or unsubstituted benzotriazole is included as the corrosion inhibitor. Suitable examples of the substituted benzotriazole include, but are not limited to, a benzotriazole substituted with an alkyl group, an aryl group, a halogen group, an amino group, a nitro group, an alkoxy group, or a hydroxyl group. Other examples of the substituted benzotriazole include benzotriazoles fused with one or more aryl (for example, phenyl) or heteroaryl groups.

Examples of the benzotriazole which is suitable for use as the corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole (5-MBTA), benzotriazole 5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl) benzotriazole, 5-n-octylbenzotriazole, and 5-(1',1',3',3'-tetramethylbutyl)benzotriazole.

In addition, as the benzotriazole, 2,2'-{[(4-methyl-1H-benzotriazol-1-yl)methyl]imino}bisethanol, 2,2-{[(5-methyl-1H-benzotriazol-1-yl)methyl]imino}bisethanol, 2,2'-{[(4-methyl-1H-benzotriazol-1-yl)methyl] imino}bisethane, or 2,2'-{[(4-methyl-1H-benzotriazol-1-yl) methyl]imino}bispropane, and N,N-bis(2-ethylhexyl)-(4 or 5)-methyl-1H-benzotriazole-1-methylamine, or the like can be used.

The corrosion inhibitor may be used singly or in combination of two or more kinds thereof.

From the viewpoint of further improving the anticorrosion properties, it is preferable that the corrosion inhibitor includes at least one compound selected from a compound represented by Formula (A), a compound represented by Formula (B), a compound represented by Formula (C), or a substituted or unsubstituted tetrazole.

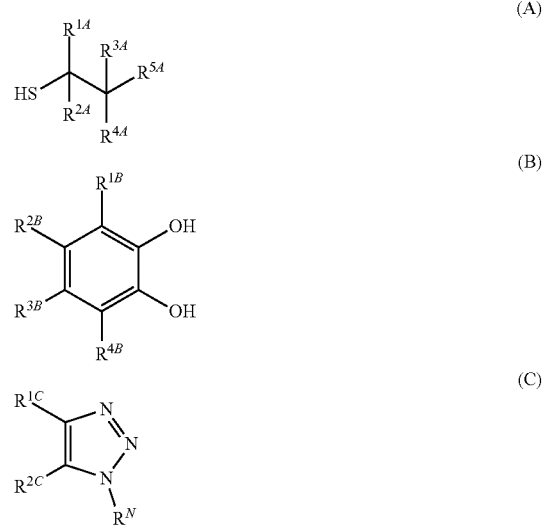

In Formula (A), $R^{1A}$ to $R^{5A}$ each independently represent a hydrogen atom, a substituted or unsubstituted hydrocarbon group, a hydroxyl group, a carboxyl group, or a substituted or unsubstituted amino group, provided that at least one group selected from a hydroxyl group, a carboxyl group, or a substituted or unsubstituted amino group is included in the structure.

In Formula (B), $R^{1B}$ to $R^{4B}$ each independently represent a hydrogen atom, or a substituted or unsubstituted hydrocarbon group.

In Formula (C), $R^{1C}$, $R^{2C}$, and $R^{N}$ each independently represent a hydrogen atom, or a substituted or unsubstituted hydrocarbon group. Incidentally, $R^{1C}$ and $R^{2C}$ may be bonded to each other to form a ring.

In Formula (A), as the hydrocarbons represented by $R^{1A}$ to $R^{5A}$, an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Furthermore, examples of the substituent in a case where the hydrocarbon group is substituted include a hydroxyl group, a carboxyl group, and a substituted or unsubstituted amino group (the substituent in a case where the amino group is substituted is preferably an alkyl group having 1 to 6 carbon atoms, and more preferably an alkyl group having 1 to 3 carbon atoms).

In addition, in Formula (A), at least one group selected from a hydroxyl group, a carboxyl group, or a substituted or unsubstituted amino group (the substituent in a case where the amino group is substituted is preferably an alkyl group having 1 to 6 carbon atoms, and more preferably an alkyl group having 1 to 3 carbon atoms) is included in the structure.

In Formula (A), examples of the substituted or unsubstituted hydrocarbon group represented by $R^{1A}$ to $R^{5A}$ include a hydrocarbon group having 1 to 6 carbon atoms, which is substituted with a hydroxyl group, a carboxyl group, or an amino group.

Examples of the compound represented by Formula (A) include 1-thioglycerol, L-cysteine, and thiomalic acid.

In Formula (B), the substituted or unsubstituted hydrocarbon groups represented by $R^{1B}$ to $R^{4B}$ each have the same definitions as the substituted or unsubstituted hydrocarbon groups represented by $R^{1A}$ to $R^{5A}$ in Formula (A).

Preferred examples of the substituted or unsubstituted hydrocarbon groups represented by $R^{1B}$ to $R^{4B}$ include a hydrocarbon group having 1 to 6 carbon atoms, such as a methyl group, an ethyl group, a propyl group, and a t-butyl group.

Examples of the compound represented by Formula (B) include catechol and t-butyl catechol.

In Formula (C), examples of the substituted or unsubstituted hydrocarbon groups represented by $R^{1C}$, $R^{2C}$, and $R^N$ each have the same definitions as the substituted or unsubstituted hydrocarbon groups represented by $R^{1A}$ to $R^{5A}$ in Formula (A).

Preferred examples of the substituted or unsubstituted hydrocarbon groups represented by $R^{1C}$, $R^{2C}$, and $R^N$ include a hydrocarbon group having 1 to 6 carbon atoms, such as a methyl group, an ethyl group, a propyl group, and a butyl group.

Furthermore, $R^{1C}$ and $R^{2C}$ may be bonded to each other to form a ring, and examples of a ring formed by the bonding of $R^{1C}$ and $R^{2C}$ include a benzene ring. In a case where $R^{1C}$ and $R^{2C}$ are bonded to each other to form a ring, they may further have a substituent (for example, a hydrocarbon group having 1 to 5 carbon atoms).

Examples of the compound represented by Formula (C) include 1H-1,2,3-triazole, benzotriazole, 5-methyl-1H-benzotriazole, 2,2'-{[(4-methyl-1H-benzotriazol-1-yl)methyl]imino}bisethanol (trade name "IRGAMET 42" manufactured by BASF), and N,N-bis(2-ethylhexyl)-(4 or 5)-methyl-1H-benzotriazole-1-methylamine (trade name "IRGAMET 39" manufactured by BASF).

Examples of the substituted or unsubstituted tetrazole include an unsubstituted tetrazole, and a tetrazole having a hydroxyl group, a carboxyl group, or a substituted or unsubstituted amino group as a substituent. Here, the substituent in a case where the amino group is substituted is preferably an alkyl group having 1 to 6 carbon atoms, and more preferably an alkyl group having 1 to 3 carbon atoms.

The content of the corrosion inhibitor in the treatment liquid is preferably 0.01% to 5% by mass, more preferably 0.05% to 5% by mass, and still more preferably 0.1% to 3% by mass, with respect to the total mass of the treatment liquid.

The corrosion inhibitor may be used singly or in combination of two or more kinds thereof. In a case where two or more kinds of the corrosion inhibitors are used in combination, the total amount thereof is preferably within the above-mentioned range.

As the corrosion inhibitor, a high-purity grade of the corrosion inhibitor having reduced contents of Ca, Fe, and Na is preferably used, and the corrosion inhibitor which has been further purified is more preferably used.

A method for purifying the corrosion inhibitor is not particularly limited, but known methods such as filtration, ion exchange, distillation, adsorption purification, recrystallization, reprecipitation, sublimation, and purification using a column are used, and these methods can also be combined to apply.

<Specific Metal Elements>

The treatment liquid of the embodiment of the present invention contains specific metal elements. The specific metal elements in the present invention refer to Ca, Fe, and Na as described above, and the treatment liquid of the embodiment of the present invention contains all of Ca, Fe, and Na.

Here, the specific metal elements may be in any form of an ion, a complex compound, a metal salt, an alloy, and the like. In addition, the specific metal elements may be in the state of particles.

The specific metal elements may be metal elements inevitably included in the respective components (raw materials) included in the treatment liquid or metal elements inevitably included during the production of the treatment liquid, or may be metal elements intentionally added.

All of the content of Ca, the content of Fe, and the content of Na are preferably 0.1 ppt by mass to 10 ppb by mass, more preferably 1 ppt by mass to 10 ppb by mass, and still more preferably 1 ppt by mass to 100 ppt by mass, with respect to the total mass of the treatment liquid. By adjusting each of the contents of the specific metal elements to be within the range, generation of defects is further reduced. In addition, the removing capability of residues such as an etching residue of the insulating film and the metal hard mask, which will be described later, is also improved.

In the present invention, the content of each of the specific metal elements in the treatment liquid is measured by an inductively coupled plasma mass spectrometry (ICP-MS) method. Measurement of the content of each of the specific metal elements by the ICP-MS method can be performed, for example, by using a device in accordance with NexION350S (trade name, manufactured by Perkin Elmer, Inc.).

Here, in the ICP-MS method, the content is quantified as a total mass (also referred to as a "total metal amount") of each of the specific metal elements in the treatment liquid, that is, the total mass of ionic metals (metal ions) and non-ionic metals (for example, particulate specific metal elements, that is, metal particles). Accordingly, in the present invention, a simple reference to "the content of each of the specific metal elements in the treatment liquid" indicates the total content (total metal amount) of each of the specific metal elements in the treatment liquid, regardless of the forms of each of the specific metal elements.

Each of the mass ratio of the Ca, the mass ratio of the Fe, and the mass ratio of the Na with respect to the organic alkali compound in the treatment liquid of the embodiment of the present invention is $10^{-12}$ to $10^{-4}$, preferably $10^{-12}$ to $10^{-7}$, and more preferably $10^{-12}$ to $10^{-8}$. By adjusting each of the mass ratios of the specific metal elements with respect to the organic alkali compound to be within the range, generation of defects is reduced. In addition, the removing capability of residues such as an etching residue of the insulating film and the metal hard mask, which will be described later, are also improved.

Each of the mass ratio of the Ca, the mass ratio of the Fe, and the mass ratio of the Na with respect to the corrosion inhibitor in the treatment liquid is preferably $10^{-12}$ to $10^{-4}$, more preferably $10^{-12}$ to $10^{-7}$, and still more preferably $10^{-12}$ to $10^{-8}$. By adjusting each of the mass ratios of the specific metal elements with respect to the corrosion inhibitor to be within the range, the corrosion resistance of the metal layer, the reduction of defects, and the residue removing capability can be simultaneously satisfied at a high level. Incidentally, the residue removing capability refers to the removing capability of residues such as an etching residue of the insulating film and the metal hard mask, which will be described later.

Here, it is presumed that in a case where the content of the specific metal elements in the treatment liquid is high, the treatment liquid is easily adsorbed on the surface of the metal layer, and thus, the adsorption efficiency of the corrosion inhibitor can be improved. In this manner, in order to enhance the effect of corrosion resistance, a high content of the specific metal elements is preferable, but there is a tendency that the residue removing capability, the defect performance, or the like is deteriorated. As a result, by adjusting the mass ratio of the specific metal elements to the corrosion inhibitor to be within the above-mentioned range, both the performance can be satisfied at a high level.

<Organic Solvent>

The treatment liquid of the embodiment of the present invention contains an organic solvent. By incorporation of the organic solvent, the removing capability of a resist can be further improved or the anticorrosion effect can be further improved.

As the organic solvent, all of known organic solvents can be used, but a hydrophilic organic solvent is preferable. The hydrophilic organic solvent means an organic solvent which can be uniformly mixed with water at any ratio.

Specific examples of the hydrophilic organic solvent include a water-soluble alcohol-based solvent, a water-soluble ketone-based solvent, a water-soluble ester-based solvent, a water-soluble ether-based solvent (for example, glycol diether), a sulfone-based solvent, a sulfoxide-based solvent, a nitrile-based solvent, and an amide-based solvent, and in order to obtain desired effects, all of those solvents can be used.

Examples of the water-soluble alcohol-based solvent include an alkanediol (including, for example, alkylene glycol), an alkoxyalcohol (including, for example, glycol monoether), a saturated aliphatic monohydric alcohol, an unsaturated non-aromatic monohydric alcohol, and a low-molecular-weight alcohol including a ring structure.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycol.

Examples of the alkylene glycol include ethylene glycol, propylene glycol, diethylene glycol, dipropylene glycol, triethylene glycol, and tetraethylene glycol.

Examples of the alkoxyalcohol include 3-methoxy-3-methyl-1-butanol, 3-methoxy-1-butanol, 1-methoxy-2-butanol, and glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol mono-n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the water-soluble ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of the water-soluble ester-based solvent include ethyl acetate, glycol monoesters such as ethylene glycol monoacetate and diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Among those, ethylene glycol monobutyl ether, tri(propylene glycol) methyl ether, and diethylene glycol monoethyl ether are preferable.

Examples of the sulfone-based solvent include sulfolane, 3-methyl sulfolane, and 2,4-dimethyl sulfolane.

Examples of the sulfoxide-based solvent include dimethyl sulfoxide.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, ε-caprolactam, formamide, N-methylformamide, acetamide, N-methylacetamide, N,N-dimethylacetamide, N-methylpropaneamide, and hexamethylphosphoric triamide.

Among the hydrophilic organic solvents, from the viewpoint of further improving the anticorrosion effect, the water-soluble alcohol-based solvent, the sulfone-based solvent, the amide-based solvent, and the sulfoxide-based solvent are preferable, and the water-soluble alcohol-based solvent and the sulfoxide-based solvent are more preferable.

The content of the organic solvent is not particularly limited, and may be any one of 1% to 99.999% by mass with respect to the total mass of the treatment liquid.

The organic solvent may be used singly or in combination of two or more kinds thereof. In a case where two or more kinds of the organic solvents are used in combination, the total amount thereof is preferably within the above-mentioned range.

As the organic solvent, a high-purity organic solvent having small contents of Ca, Fe, and Na is preferably used, and the high-purity organic solvent which has been further purified is more preferably used.

The purification method is not particularly limited, but a known method such as filtration, ion exchange, distillation, adsorption purification, recrystallization, reprecipitation, sublimation, and purification using a column is used, and these methods can also be combined to apply.

The organic solvent having small contents of Ca, Fe, and Na can be used in each of the embodiments of the present invention, and can be suitably used, for example, in a device for the manufacture or production of a kit or a concentrate which will be described later, applications for washing a container, or the like.

<Water>

It is preferable that the treatment liquid of the embodiment of the present invention further contains water.

The water is not particularly limited, but ultrapure water used for the manufacture of a semiconductor is preferably used, and water obtained by further purifying the ultrapure water to reduce the amount of inorganic anions, metal ions, and the like is more preferably used. The purification method is not particularly limited, but purification using a filtering film or an ion exchange membrane, or purification using distillation is preferable. In addition, it is preferable that the purification is performed, for example, by the method described in JP2007-254168A.

The contents of Ca, Fe, and Na included in the water are each preferably 0.1 ppt by mass to 10 ppb by mass with respect to the total mass of water. The water having small contents of Ca, Fe, and Na can be used in each of the embodiments of the present invention, and can be suitably used, for example, in a device for the manufacture or production of a kit or a concentrate which will be described later, applications for washing a container, or the like.

The composition of the treatment liquid of the embodiment of the present invention can be adjusted by modifying the content of the organic solvent and the content of the water. A treatment liquid in which the content of the water in the treatment liquid is larger than the content of the organic solvent is defined as a "water-based treatment liquid", and a treatment liquid in which the content of the organic solvent in the treatment liquid is larger than the content of the water is defined as a "solvent-based treatment liquid".

(Water-Based Treatment Liquid)

In a case of using the water-based treatment liquid, it is preferable that the content of the water is 20% to 98% by mass with respect to the total mass of the treatment liquid, and the content of the organic solvent is 1% to 40% by mass with respect to the total mass of the treatment liquid.

In a case of using the water-based treatment liquid, the content of the water is preferably 35% to 98% by mass, and more preferably 50% to 95% by mass.

In a case of using the water-based treatment liquid, the content of the organic solvent is preferably 5% to 35% by mass, and more preferably 10% to 30% by mass, with respect to the total mass of the treatment liquid.

(Solvent-Based Treatment Liquid)

In a case of using the solvent-based treatment liquid, it is preferable that the content of the water is 1% to 30% by mass with respect to the total mass of the treatment liquid, and the content of the organic solvent is 20% to 98% by mass with respect to the total mass of the treatment liquid.

In a case of using the solvent-based treatment liquid, the content of the water is preferably 2% to 25% by mass, and more preferably 4% to 20% by mass, with respect to the total mass of the treatment liquid.

In a case of using the solvent-based treatment liquid, the content of the organic solvent is preferably 40% to 98% by mass, more preferably 45% to 98% by mass, and still more preferably 50% to 95% by mass, with respect to the total mass of the treatment liquid.

<Halogen Acid>

It is preferable that the treatment liquid of the embodiment of the present invention further contains halogen acid. By incorporation of the halogen acid into the treatment liquid, the removing capability for residues (etching residues) generated by etching of the insulating film, the metal layer, or the like during the manufacture of a semiconductor device is improved.

Examples of the halogen acid include hydrogen halides such as hydrogen fluoride, hydrogen chloride, hydrogen bromide, and hydrogen iodide, and among these, from the viewpoint that the removing capability for etching residues is further improved, hydrogen fluoride is preferable.

The content of the halogen acid in the treatment liquid is preferably 0.01% to 5% by mass, more preferably 0.05% to 5% by mass, and still more preferably 0.1% to 3% by mass, with respect to the total mass of the treatment liquid.

The halogen acid may be used singly or in combination of two or more kinds thereof. In a case where two or more kinds of the treatment liquids are used in combination, the total amount thereof is preferably within the above-mentioned range.

<Other Additives>

The treatment liquid of the embodiment of the present invention may contain additives other than the above-mentioned components. Examples of such other additives include a chelating agent.

(Chelating Agent)

The chelating agent is chelated with an oxidized metal included in the residues. Thus, the recyclability of the treatment liquid is improved by addition of the chelating agent.

The chelating agent is not particularly limited, but is preferably a polyaminopolycarboxylic acid.

The polyaminopolycarboxylic acid is a compound having a plurality of amino groups and a plurality of carboxylic acid groups, and examples thereof include a mono- or polyalkylenepolyamine polycarboxylic acid, a polyaminoalkane polycarboxylic acid, a polyaminoalkanol polycarboxylic acid, and a hydroxyalkyl ether polyamine polycarboxylic acid.

Suitable examples of the polyaminopolycarboxylic acid chelating agent include butylene diaminetetraacetic acid, diethylenetriaminepentaacetic acid (DTPA), ethylenediaminetetrapropionic acid, triethylenetetraaminehexaacetic acid, 1,3-diamino-2-hydroxypropane-N,N,N',N'-tetraacetic acid, propylene diaminetetraac etic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododec ane-tetraacetic acid, diaminopropanoltetraacetic acid, and (hydroxyethyl)ethylenediaminetriacetic acid. Among those, diethylenetriamine pentaacetic acid (DTPA), ethylenediamine tetraacetic acid (EDTA), and trans-1,2-diaminocyclohexane tetraacetic acid are preferable.

In a case where the treatment liquid contains a chelating agent, the content of the chelating agent is preferably 0.01% to 5% by mass, and more preferably 0.01% to 3% by mass, with respect to the total mass of the treatment liquid.

The chelating agent may be used singly or in combination of two or more kinds thereof. In a case where two or more kinds of the chelating agents are used in combination, the total amount thereof is preferably within the above-mentioned range.

In addition, examples of such other additives include a pH adjuster, a surfactant, a defoamer, a rust inhibitor, and a preservative.

<Coarse Particles>

It is preferable that the treatment liquid of the embodiment of the present invention substantially does not include coarse particles.

The coarse particles refer to particles having a diameter of 0.2 μm or more, for example, in a case of considering the shapes of the particles as spheres. Further, the expression, substantially not including coarse particles, indicates that the number of particles in a diameter of 0.2 μm or more in 1 mL of the treatment liquid in a case where measurement of the treatment liquid using a commercially available measuring device in a light scattering type in-liquid particle measurement method system is carried out is 10 or less.

Furthermore, the coarse particles included in the treatment liquid are particles of dusts, organic solids, inorganic solids, or the like which are included as impurities in raw materials, or particles of dusts, organic solids, inorganic solids, or the like which are incorporated as a contaminant during the preparation of a treatment liquid, and correspond to the particles which are not ultimately dissolved in the treatment liquid and present as particles.

The amount of the coarse particles present in the treatment liquid can be measured in the liquid phase, using a laser as a light source.

Examples of a method for removing the coarse particles include a treatment such as filtering which will be described later.

<Physical Properties of Treatment Liquid>

The pH of the treatment liquid of the embodiment of the present invention is preferably more than 9 and less than 15. By adjusting the pH of the treatment liquid to be in such an alkali region as described, the removing capability of the organic alkali compound and/or the corrosion inhibitor, and salts with the specific metal elements is further improved. Thus, the removing performance for the resist is further improved, the anticorrosion properties of the metal layer is further improved, or the residue removing capability is improved.

The lower limit value of the pH of the treatment liquid is preferably more than 9, but from the viewpoint that the removing performance for the resist, the anticorrosion properties of the metal, and the residue removing capability are still further improved, the lower limit value is more preferably 9.3 or more, and still more preferably 11 or more.

The upper limit value of the pH of the treatment liquid is preferably less than 15, and from the viewpoint that generation of defects is further reduced, the upper limit value is more preferably 14.5 or less, and still more preferably 14.2 or less.

The pH of the treatment liquid can be measured using a known pH meter.

For the treatment liquid of the embodiment of the present invention, in a case where the viscosity of the treatment liquid of the embodiment of the present invention at room temperature is measured using a rotational viscometer, the ratio (viscosity B/viscosity A) of the viscosity of the treatment liquid at a rotation speed of 100 rpm (viscosity B) to the viscosity of the treatment liquid at a rotation speed of 1,000 rpm (viscosity A) is preferably 1 to 20, more preferably 1 to 15, and still more preferably 1 to 10. By setting the viscosity ratio to 1 or more, the total amount of the liquid in contact with the substrate and the resist increases, and thus, the removal of the resist and the removal of the residues can be efficiently performed, whereas by setting the viscosity ratio to 20 or less, the treatment liquid hardly remains on the surface of the substrate, and thus, defects are hardly generated.

In addition, the room temperature in the measurement of the viscosity of the treatment liquid is typically 20° C. to 25° C., and preferably 23° C.

The viscosity of the treatment liquid is measured using a device equivalent to a rotational viscometer DV-E (trade name, manufactured by Brookfield).

<Applications>

The treatment liquid of the embodiment of the present invention is a treatment liquid for a semiconductor device. In the present invention, the expression, "for a semiconductor device" means a use in the manufacture of a semiconductor device. The treatment liquid of the embodiment of the present invention can also be used in any steps for manufacturing a semiconductor device, and can be used in treatments of, for example, an insulating film, a resist, etching residues, an antireflection film, and ashing residues, which are present on a substrate.

The treatment liquid is used as a pre-wet liquid applied on a substrate in order to improve the coatability of an actinic ray-sensitive or radiation-sensitive composition before a step of forming a resist film using the composition; a resist removing liquid (a peeling liquid) used for the removal of a resist which is at least one of a resist film or residues of the resist film; a washing liquid (for example, a rinsing liquid) used for the removal of residues such as an etching residue adhering onto a metal film or an insulating film; a solution (for example, a removing liquid and a peeling liquid) used for the removal of various resist films for pattern formation; a solution (for example, a removing liquid and a peeling liquid) used for the removal of a permanent film (for example, a color filter, a transparent insulating film, and a resin-made lens) or the like from a semiconductor substrate; or the like. Further, the treatment liquid can also be used as a developer for various resists for pattern formation. In addition, the semiconductor substrate after the removal of the permanent film may be employed again in a use of a semiconductor device in some cases, and therefore, the removal of the permanent film is included in the step of manufacturing a semiconductor device.

The treatment liquid of the embodiment of the present invention may be used only in one or two or more of the applications.

Here, as miniaturization and high functionalization of semiconductor devices proceed, metals used for wiring materials, plug materials, or the like are required to be more electrically conductive. For example, it is predicted that substitution of aluminum (Al) and copper (Cu) in the metals used as the wiring material with cobalt (Co) proceeds, and substitution of tungsten (W) in the metals used as the plug materials with Co proceeds. Thus, particularly, less corrosion with Co is required.

In contrast to such a problem, in a case where the semiconductor device has a substrate comprising a metal layer including Co, the treatment liquid of the embodiment of the present invention is suitably used for a treatment to the metal layer. This is presumed to be caused by the following: the corrosion inhibitor included in the treatment liquid of the embodiment of the present invention can suppress corrosion of the metal layer including Co effectively. In particular, in the present invention, it is presumed that the specific metal elements included in the treatment liquid are effectively adsorbed by the surface of the metal layer including Co, and the adsorption efficiency of the corrosion inhibitor can be improved.

In addition, among the above-mentioned applications of the treatment liquid, from the viewpoint that the effects of the treatment liquid of the embodiment of the present invention are further exerted, the treatment liquid of the embodiment of the present invention is suitably used for the removal of at least one of the resist film or a residue of the resist.

[Kit and Concentrate]

The treatment liquid in the embodiment of the present invention may be used in the form of a kit having raw materials of the treatment liquid divided into a plurality of parts. In particular, in a case where the treatment liquid contains at least one selected from a hydroxylamine or a hydroxylamine salt, or a case where the treatment liquid contains a quaternary ammonium salt, it is preferably used in the form of the kit.

Although not being particularly limited, examples of a specific method for using the treatment liquid in the form of the kit include an aspect in which a liquid composition containing at least one organic alkali compound selected from a hydroxylamine or a hydroxylamine salt in water and/or an organic solvent is prepared as a first liquid, and a liquid composition containing the other components such as a corrosion inhibitor is prepared as a second liquid. In a use example thereof, it is preferable that both the liquids are mixed to prepare a treatment liquid, and then applied to the above-mentioned applications at an appropriate time. The other respective components may be contained in any one of the first liquid and the second liquid. Such a configuration does not result in deterioration of the liquid performance, and thus, a desired action can be effectively exerted. The contents of the respective components in the first liquid and the second liquid can be appropriately set as a content after mixing, based on the above-described content.

Furthermore, other examples of the method include an example in which a liquid composition containing a quaternary ammonium salt is prepared as a first liquid and a liquid composition containing the other components such as a corrosion inhibitor is prepared as a second liquid. It is preferable that both the liquids are mixed to prepare a treatment liquid, and then applied to the above-mentioned applications at an appropriate time. The other respective components may be contained in any one of the first liquid and the second liquid. Such a configuration does not result in deterioration of the liquid performance, and thus, a desired action can be effectively exerted. The contents of the respective components in the first liquid and the second liquid can be appropriately set as a content after mixing, based on the above-described content.

In addition, the treatment liquid may be prepared as a concentrate. In this case, it can be used after being diluted with water and/or an organic solvent at the time of use.

[Container (Housing Container)]

The treatment liquid of the embodiment of the present invention can be filled in any container as long as the container does not have any problem such as corrosion properties (irrespective of whether the treatment liquid is a kit or a concentrate), transported, and used. As for the container, as a container used in semiconductor applications, a container which has high cleanliness in the container and less elution of impurities is preferable. Examples of the usable container include, but are not limited to, "CLEAN BOTTLE" series (manufactured by Aicello Chemical Co., Ltd.) and "PURE BOTTLE" (manufactured by Kodama Plastics Co., Ltd.). The inner wall of the container is preferably formed of one or more resins selected from the group consisting of a polyethylene resin, a polypropylene resin, and a polyethylene-polypropylene resin, other resins, and a metal which has been antirust and metal elution preventing treatments, such as stainless steel, Hastelloy, Inconel, and Monel.

As such other resins, a fluorine-based resin (perfluoro resin) can be preferably used. In this manner, by using a container having an inner wall formed of a fluorine-based resin, occurrence of a problem of elution of ethylene or propylene oligomers can be suppressed, as compared with a case of using a container having an inner wall formed of a polyethylene resin, a polypropylene resin, or a polyethylene-polypropylene resin.

Specific examples of such a container having an inner wall which is a fluorine-based resin include a Fluoro-PurePFA composite drum manufactured by Entegris Inc. Further, the containers described in page 4 of JP1991-502677A (JP-H03-502677A), page 3 of WO2004/016526A, pages 9 and 16 of WO99/046309A, or the like can also be used.

Moreover, for the inner wall of the container, the quartz and the electropolished metal material (that is, the metal material which has been completely electropolished) are also preferably used, in addition to the above-mentioned fluorine-based resin.

The electropolished metal material is preferably a metal material which contains at least one selected from the group consisting of chromium and nickel, and has a total content of chromium and nickel of more than 25% by mass with respect to the total mass of the metal material. Examples of the metal material include stainless steel and a nickel-chromium alloy.

The total content of chromium and nickel in the metal material is preferably 25% by mass or more, and more preferably 30% by mass or more, with respect to the total mass of the metal material.

In addition, the upper limit value of the total content of chromium and nickel in the metal material is not particularly limited, but in general, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

The nickel-chromium alloy is not particularly limited and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy C (Ni content of 60% by mass, Cr content of 17% by mass), and Hastelloy C-22 (Ni content of 61% by mass, Cr content of 22% by mass).

In addition, the nickel-chromium alloy may further contain boron, silicon, tungsten, molybdenum, copper, cobalt, or the like, as desired, in addition to the above-mentioned alloys.

The method of electropolishing the metal material is not particularly limited, and known methods can be used. For example, the methods described in paragraphs <0011> to <0014> of JP2015-227501A, paragraphs <0036> to <0042> of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, impurities are hardly eluted into the container.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of the abrasive grains.

For the container, it is preferable to wash the inside of the container before filling. The metal elements included in a liquid used for washing are preferably within a range of mass ratios of the metal elements to the organic alkali compound in the treatment liquid. The liquid may be appropriately selected depending on the application, but as long as the liquid is a liquid having a mass ratio of the metal elements adjusted to be in the same range as that of the treatment liquid by purifying other organic solvents; the treatment liquid of the embodiment of the present invention as it is; a dilution of the treatment liquid of the embodiment of the present invention; or a liquid including at least one of the components added to the treatment liquid of the embodiment of the present invention, the effects of the present invention are noticeably obtained. The treatment liquid of the embodiment of the present invention may be bottled in a container such as a gallon bottle and a coated bottle after the production, transported, and stored.

In order to prevent the modifications in the components in the treatment liquid during the storage, the inside of the container may be purged with inert gas (nitrogen, argon, or the like) with a purity of 99.99995% by volume or more. In particular, a gas having a low moisture content is preferable. In addition, during the transportation or storage, the temperature may be controlled to a normal temperature in the range of −20° C. to 20° C. to prevent deterioration.

[Clean Room]

It is preferable that handlings including production of the treatment liquid of the embodiment of the present invention, opening and/or washing of a housing container, filling of the treatment liquid, and the like, treatment analysis, and measurements are all performed in clean rooms. The clean rooms preferably satisfy 14644-1 clean room standards. It is preferable to satisfy any one of International Standards Organization (ISO) Class 1, ISO Class 2, ISO Class 3, or ISO Class 4, it is more preferable to satisfy either ISO Class 1 or ISO Class 2, and it is still more preferable to satisfy ISO Class 1.

[Filtering]

It is preferable that the treatment liquid of the embodiment of the present invention is filtered in order to adjust the mass ratio of each of the specific metal elements to be in a desired range or to remove foreign matters, coarse particles, and the like.

As a filter used for filtering, any filter which has been used in the filtering applications or the like from the related art can be used without particular limitation. Examples of the materials constituting the filter include fluorine resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among these materials, polyamide-based resins, PTFE, and polypropylene (including high-density polypropylene) are preferable, and by using a filter formed with these materials, high-polarity foreign matters which are likely to cause residue defects or particle defects can be more effectively removed, and in addition, the amounts of the specific metal elements of the present invention can be more efficiently reduced.

For the critical surface tension of the filter, the lower limit value is preferably 70 mN/m or more, and the upper limit value is preferably 95 mN/m or less. In particular, the critical surface tension of the filter is preferably from 75 mN/m to 85 mN/m.

In addition, the value of the critical surface tension is a nominal value of a manufacturer. By using a filter having a critical surface tension in the range, high-polarity foreign matters which are likely to cause residue defects or particle defects can be more effectively removed, and in addition, the amount of the specific metal elements of the present invention can be more efficiently reduced.

The pore diameter of the filter is preferably approximately 0.001 to 1.0 µm, more preferably approximately 0.02 to 0.5 µm, and more preferably approximately 0.01 to 0.1 µm. By adjusting the pore diameter of the filter to be in the range, it is possible to reliably remove fine foreign matters included in the treatment liquid while suppressing clogging in filtering.

In addition, from the viewpoint of reducing the amount of each of the specific metal elements of the present invention, it is preferable that the pore diameter of the filter is set to 0.05 µm or less. The pore diameter of the filter in case of adjusting the amount of the specific metal elements is more preferably from 0.005 µm to 0.04 µm, and still more preferably from 0.01 µm to 0.02 µm. With the pore diameter being in the range, the pressure required for filtering can be kept low, filtering can be efficiently performed, and thus, desired effects can be noticeably obtained.

In a case of using filters, different filters may be combined. At that time, the filtering with the first filter may be performed once or twice or more times. In a case where the filtering is performed twice or more times by combining different filters, the respective filters may be of the same kinds or of different kinds from each other, and are preferably of different kinds from each other. Typically, it is preferable that the first filter and the second filter have a difference in at least one of the pore diameter or the constituent materials.

The pore diameter at the second filtering or later is preferably the same as or smaller than the pore diameter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PEclean filter (pore diameter of 0.02 μm)"; (manufactured by Nihon Pall Ltd.), and a high-density polyethylene-made "PEclean filter (pore diameter of 0.01 μm)"; (manufactured by Nihon Pall Ltd.) can also be used.

As the second filter, a filter formed of the same materials as those of the first filter can be used. A filter having the same pore diameter as that of the above-mentioned first filter can be used. In a case of using the second filter having a smaller pore diameter than that of the first filter, the ratio of the pore diameter of the second filter to the pore diameter of the first filter (pore diameter of second filter/pore diameter of first filter) is preferably 0.01 to 0.99, more preferably 0.1 to 0.9, and still more preferably 0.3 to 0.9. By adjusting the pore diameter of the second filter to be in the range, fine foreign matters incorporated into the treatment liquid are more reliably removed.

For example, filtering using a first filter may be performed with a mixed liquid including some components of the treatment liquid, the residual components may be mixed therewith to prepare a treatment liquid, and then filtering using a second filter may be carried out.

Moreover, the filter used is preferably treated before filtering the treatment liquid. The liquid used in this treatment is not particularly limited, but as long as the liquid is a liquid having a content of the metal element adjusted to be in the same range as that of the treatment liquid by purifying organic solvents; the treatment liquid of the embodiment of the present invention as it is; a dilution of the treatment liquid of the embodiment of the present invention; or a liquid containing the components included in the treatment liquid, desired effects are noticeably obtained.

In a case of performing filtering, the upper limit value in the temperature during the filtering is preferably room temperature (25° C.) or lower, more preferably 23° C. or lower, and still more preferably 20° C. or lower. Further, the lower limit value in the temperature during the filtering is preferably 0° C. or higher, more preferably 5° C. or higher, and still more preferably 10° C. or higher.

In the filtering, particulate foreign matters or impurities can be removed, but in a case of performing the filtering at the temperature, the amounts of the particulate foreign matters or impurities dissolved in the treatment liquid are reduced, and therefore, the filtering is more efficiently performed.

In particular, it is preferable that the treatment liquid of the embodiment of the present invention including an ultra-trace amount of the specific metal elements is filtered at the above temperature. Although the mechanism is not clear, it is considered that most of the specific metal elements are present in the particulate colloidal state. It is considered that in a case of performing filtering at the above temperature, some of the specific metal elements floating in the colloidal shape are aggregated, the aggregates are thus efficiently removed by filtering, and therefore, the content of the specific metal elements is easily adjusted to a desired amount.

Moreover, the filter used is preferably treated before filtering the treatment liquid. The liquid used in this treatment is not particularly limited, but the content of each of the above-mentioned specific metal elements is preferably less than 0.001 ppt by mass. As long as the liquid is a liquid having a content each of the above-mentioned specific metal elements adjusted to be in the above range by purifying the above-mentioned organic solvents; the treatment liquid of the embodiment of the present invention as it is; a dilution of the treatment liquid; or a liquid having reduced specific metal elements, impurities, and coarse particles by further performing purification, the desired effects of the present invention are noticeably obtained.

[Method for Washing Substrate]

The method for washing a substrate of the embodiment of the present invention has a washing step B in which a substrate comprising a metal layer including Co is washed using the treatment liquid. Further, the method for washing a substrate of the embodiment of the present invention may have a treatment liquid preparing step A in which the treatment liquid is prepared before the washing step B.

In the following description of the method for washing a substrate, a case where the treatment liquid preparing step A is carried out before the washing step B is presented by way of an example, but is not restrictive, and the method for washing a substrate of the embodiment of the present invention may be performed using the treatment liquid that has been prepared in advance.

<Washing Target>

As long as the washing target of the method for washing a substrate of the embodiment of the present invention is a substrate comprising a metal layer including Co, it is not particularly limited, but examples thereof include a laminate comprising at least the metal layer, an interlayer insulating film, and a metal hard mask in this order on a substrate. The laminate may have holes formed toward the substrate from the surface (apertures) of the metal hard mask so as to expose the surface of the metal layer through a dry etching step or the like.

A method for producing a laminate having holes as described above is not particularly limited, but common examples thereof include a method in which a laminate before the treatment, having a substrate, a metal layer, an interlayer insulating film, and a metal hard mask in this order, is subjected to a dry etching step using the metal hard mask as a mask, and the interlayer insulating film is etched so as to expose the surface of the metal layer to provide holes passing through the inside of the metal hard mask and the interlayer insulating film.

Furthermore, a method for producing the metal hard mask is not particularly limited, and examples thereof include a method in which a metal film including predetermined components is firstly formed on an interlayer insulating film, a resist film having a predetermined pattern is formed thereon, and then the metal film is etched using the resist film as a mask to produce a metal hard mask (that is, a film with a metal film that is patterned).

In addition, the laminate may have layers other than the above-mentioned layer, and examples of such other layers include an etching stop film and an antireflection layer.

FIG. 1 illustrates a schematic cross-sectional view showing an example of a laminate which is a washing target in the method for washing a substrate of the embodiment of the present invention.

A laminate 10 shown in FIG. 1 comprises a metal film 2, an etching stop layer 3, an interlayer insulating film 4, and a metal hard mask 5 in this order on a substrate 1, and has holes 6 formed by a dry etching step, through which the metal film 2 is exposed at predetermined positions. That is, the washing target shown in FIG. 1 is a laminate comprising the substrate 1, the metal film 2, the etching stop layer 3, the interlayer insulating film 4, and the metal hard mask 5 in this order, and comprising the holes 6 passing through the surface of the metal hard mask 5 at aperture positions thereof to the surfaces of the metal film 2. The inner wall 11 of the hole 6 is formed of a cross-sectional wall 11*a* including the etching stop layer 3, the interlayer insulating film 4, and the metal hard mask 5, and a bottom wall 11*b* including the exposed metal film 2, and dry etching residues 12 adhere thereto.

The method for washing a substrate of the embodiment of the present invention can be suitably used in a washing intended to remove the dry etching residues 12. That is, the performance for removing the dry etching residues 12 is excellent, and the anticorrosion properties for the inner wall 11 (for example, the metal film 2) of the washing target are also excellent.

In addition, the method for washing a substrate of the embodiment of the present invention may also be carried out for the laminate which has been subjected to a dry ashing step after the dry etching step.

Hereinafter, the respective layer constituent materials of the above-mentioned laminate will be described.

(Metal Hard Mask)

It is preferable that the metal hard mask contains at least one component selected from the group consisting of Cu, Co, W, AlOx, AN, AlOxNy, WOx, Ti, TiN, ZrOx, HfOx, and TaOx. Here, x and y each represent numbers represented by x=1 to 3 and y=1 to 2.

Examples of the materials of the metal hard mask include TiN, $WO_2$, and $ZrO_2$.

(Interlayer Insulating Film)

A material for the interlayer insulating film is not particularly limited, and examples thereof include a material, preferably having a dielectric constant k of 3.0 or less, and more preferably having a dielectric constant k of 2.6 or less.

Specific examples of the material for the interlayer insulating film include $SiO_2$— and SiOC-based materials, and organic polymers such as a polyimide.

(Etching Stop Layer)

A material for the etching stop layer is not particularly limited. Specific examples of the material for the etching stop layer include SiN—, SiON—, and SiOCN-based materials, and metal oxides such as AlOx.

(Metal Film)

A wiring material forming the metal film contains at least cobalt. Incidentally, cobalt may be an alloy with another metal.

The wiring material of the present invention may further contain metals other than cobalt, metal nitride, or an alloy. Specific examples thereof include copper, titanium, titanium-tungsten, titanium nitride, tungsten, tantalum, tantalum compounds, chromium, chromium oxide, and aluminum.

(Substrate)

A term "substrate" as mentioned herein includes, for example, a semiconductor substrate including a single layer, and examples thereof include a semiconductor substrate including multiple layers.

A material constituting the semiconductor substrate including a single layer is not particularly limited, and in general, the semiconductor substrate is preferably formed of silicon, silicon germanium, Group III to V compounds such as GaAs, and any combinations thereof.

In a case of a semiconductor substrate including multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, there may be an interlayer dielectric layer, a silicon oxide layer, a silicon nitride layer, a silicon carbide layer, a carbon-doped silicon oxide layer, or the like on the semiconductor substrate.

Hereinafter, the treatment liquid preparing step A and the washing step B will be described, respectively, in detail.

(Treatment Liquid Preparing Step A)

The treatment liquid preparing step A is a step of preparing the treatment liquid. The respective components used in the present step are as described above.

The procedure in the present step is not particularly limited, and examples thereof include a method in which an organic alkali compound, a corrosion inhibitor, and the other optional components are added to an organic solvent and water which is an optional component, and the mixture is stirred and mixed to prepare a treatment liquid. Further, in a case where the respective components are added to the organic solvent and water which is an optional component, they may be added at once or may be added in portions over a plurality of times.

In addition, as the respective components included in the treatment liquid, those classified into a semiconductor grade or those classified into a high-purity grade equivalent thereto are preferably used. Further, as for components having a large amount of impurities at the time of the raw materials, it is preferable to use the components obtained after performing removal of foreign matters by filtering and reduction in ion components with ion exchange resins or the like.

(Washing Step B)

Examples of a washing target to be washed in the washing step B include the above-mentioned laminate, and examples thereof include the laminate 10 having holes formed by carrying out a dry etching step as described above (see FIG. 1). Further, the dry etching residues 12 adhere to the inside of the holes 6 in the laminate 10.

In addition, the laminate which has been subjected to a dry ashing step after the dry etching step may be used as a washing target.

A method for bringing the treatment liquid into contact with the washing target is not particularly limited, but examples thereof include a method in which a washing target is immersed in a treatment liquid contained in a tank, a method in which a treatment liquid is sprayed onto a washing target, a method in which a treatment liquid is flowed onto a washing target, and any combinations thereof. From the viewpoint of the residue removing capability, the method in which a washing target is immersed in a treatment liquid is preferable.

A temperature of the treatment liquid is preferably set to 90° C. or lower, more preferably set to 25° C. to 80° C., still more preferably set to 30° C. to 75° C., and particularly preferably set to 40° C. to 65° C.

The washing time can be adjusted depending on the washing method used and the temperature of a treatment liquid.

In a case where washing is performed in an immersion batch mode (a batch mode in which a plurality of sheets of washing targets are immersed in a treatment tank to perform a treatment), the washing time is, for example, 60 minutes or less, preferably 1 to 60 minutes, more preferably 3 to 20 minutes, and still more preferably 4 to 15 minutes.

In a case where sheet-type washing is performed, the washing time is, for example, 10 seconds to 5 minutes, preferably 15 seconds to 4 minutes, more preferably 15 seconds to 3 minutes, and still more preferably 20 seconds to 2 minutes.

Furthermore, in order to further enhance the washing capability of the treatment liquid, a mechanical stirring method may be used.

Examples of the mechanical stirring method include a method in which a treatment liquid is circulated on a washing target, a method in which a treatment liquid is flowed through or sprayed on a washing target, and a method in which a treatment liquid is stirred with an ultrasonic or a megasonic.

(Rinsing Step B2)

The method for washing a substrate of the embodiment of the present invention may further have a step (rinsing step B2) of cleaning the washing target by rinsing it with a solvent after the washing step B.

The rinsing step B2 is preferably a step which is performed subsequently after the washing step B, and rinsing is performed with a rinsing solvent (rinsing liquid) over 5 seconds to 5 minutes. The rinsing step B2 may be performed using the above-mentioned mechanical stirring method.

Examples of the rinsing solvent include, but are not limited to, deionized (DI) water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, DI water, methanol, ethanol, and isopropyl alcohol are preferable, an aqueous ammonium hydroxide solution, DI water, and isopropyl alcohol are more preferable, and an aqueous ammonium hydroxide solution and DI water are still more preferable.

As a method for bringing the rinsing solvent into contact with the washing target, the above-mentioned method in which the treatment liquid is brought into contact with a washing target can be applied in the same manner.

The temperature of the rinsing solvent in the rinsing step B2 is preferably 16° C. to 27° C.

The above-mentioned treatment liquid may be used as a rinsing solvent in the rinsing step B2.

(Drying Step B3)

The method for washing a substrate of the embodiment of the present invention may have a drying step B3 in which the washing target is dried after the rinsing step B2.

The drying method is not particularly limited. Examples of the drying method include a spin drying method, a method of flowing a dry gas onto a washing target, a method of heating a substrate by a heating means such as a hot plate or an infrared lamp, a Marangoni drying method, a Rotagoni drying method, an isopropyl alcohol (IPA) drying method, or any combinations thereof.

The drying time depends on a specific method used, but in general, is preferably 30 seconds to several minutes.

(Ion Removing Steps F and G)

The method for washing a substrate of the embodiment of the present invention preferably has at least one step of an ion removing step F in which Ca ions, Fe ions, and Na ions are removed from at least one of the organic alkali compound, the corrosion inhibitor, or the organic solvent before the treatment liquid preparing step A, or an ion removing step G in which Ca ions, Fe ions, and Na ions in the treatment liquid are removed before performing the washing step B and after the treatment liquid preparing step A.

It is preferable that the mass ratio of Ca, Fe, and Na to the organic alkali compound in the treatment liquid used in the washing step B is adjusted to be in the above-mentioned range by carrying out at least one of the ion removing step F or the ion removing step G. In particular, there is an advantage in that the mass ratio of the Ca, Fe, and Na to the organic alkali compound is easily adjusted to be in the above-mentioned range by carrying out both the ion removing step F and the ion removing step G.

It is possible to maintain good washing performance of the treatment liquid even after the passage of time by adjusting the mass ratio of each of Ca, Fe, and Na with respect to the organic alkali compound in the treatment liquid to be in the range, which is thus excellent in recyclability.

Specific methods for the ion removing step F and the ion removing step G are not particularly limited, but examples thereof include purification by distillation or an ion exchange membrane.

In a case where water is used during the preparation of the treatment liquid in the treatment liquid preparing step A, the ion removing step F is preferably a step of removing Ca ions, Fe ions, and Na ions from at least one of the organic alkali compound, the corrosion inhibitor, the organic solvent, or the water. In this manner, it becomes easier to adjust the mass ratio of Ca, Fe, and Na to the organic alkali compound in the treatment liquid used in the washing step B to be in the above-mentioned range.

(Coarse Particle Removing Step H)

The method for washing a substrate of the embodiment of the present invention preferably has a coarse particle removing step H in which the coarse particles in the treatment liquid are removed, before carrying out the washing step B.

By reducing or removing the coarse particles in the treatment liquid, it is possible to reduce the amount of the coarse particles remaining on the washing target obtained after performing the washing step B. As a result, it is possible to suppress pattern damages caused by the coarse particles on the washing target, and an influence on a yield loss of a device and a decrease in reliability can also be suppressed.

Specific examples of a method for removing the coarse particle include a method in which the treatment liquid obtained after performing the treatment liquid preparing step A is purified by filtering, using a particle removing film having a predetermined particle removal diameter.

In addition, the definition of the coarse particles is as described above.

(Neutralization (Charge Eliminating) Steps I and J)

It is preferable that the method for washing a substrate of the embodiment of the present invention uses water during the preparation of the treatment liquid in the treatment liquid preparing step A, and includes a neutralization step I in which the water is subjected to charge elimination before the treatment liquid preparing step A, or a neutralization step J in which the treatment liquid is subjected to charge elimination before performing the washing step B and after the treatment liquid preparing step A.

It is preferable that a material for a liquid contact portion for supplying the treatment liquid to the washing target is a resin having no metal elution to the treatment liquid in order to maintain the mass ratio of the specific metal elements to the organic alkali compound to be within a predetermined range. Since such a resin has a low electrical conductivity and insulating properties, in a case where the treatment liquid is allowed to pass through a resin-made pipe, or a case where purification by filtering is performed with a resin-made particle removing film and a resin-made ion exchange resin film, there is a possibility that the charge potential of the treatment liquid increases, and thus causes electrostatic hazards.

As a result, it is preferable that in the method for washing a substrate of the embodiment of the present invention, at least one step of the above-mentioned charge eliminating step I or charge eliminating step J is carried out to reduce the charging potential of the treatment liquid. Further, by performing charge elimination, adherence of foreign matters (coarse particles or the like) onto a substrate or damages (corrosion) on the washing target can be further suppressed.

Specific examples of the charge eliminating method include a method in which water and/or the treatment liquid is brought into contact with an electrically conductive material.

The contact time during which water and/or the treatment liquid is brought into contact with the electrically conductive material is preferably 0.001 to 1 second, and more preferably 0.01 to 0.1 seconds.

Specific examples of the resin include high-density polyethylene (HDPE), high-density polypropylene (PP), 6,6-nylon, tetrafluoroethylene (PTFE), a tetrafluoroethylene/perfluoroalkylvinyl ether copolymer (PFA), polychlorotrifluoroethylene (PCTFE), an ethylene/chlorotrifluoroethylene copolymer (ECTFE), an ethylene/ethylene tetrafluoride copolymer (ETFE), and an ethylene tetrafluoride/propylene hexafluoride copolymer (FEP).

Examples of the electrically conductive material include stainless steel, gold, platinum, diamond, and glassy carbon.

In the method for washing a substrate using the treatment liquid of the embodiment of the present invention, it is possible to reuse the drainage of the treatment liquid used in the washing step B, and further use it to wash another washing target.

The method for washing a substrate of the embodiment of the present invention preferably includes the following steps in a case of an aspect of reusing the drainage of the treatment liquid:

the washing step B;
a drainage recovering step C in which drainage of the treatment liquid used in the washing step B is recovered;
a washing step D in which a newly prepared substrate comprising a metal layer including Co is washed with the recovered drainage of the treatment liquid;
a drainage recovering step E in which drainage of the treatment liquid used in the washing step D is recovered; and
a step in which the washing step D and the drainage recovering step E are repeated. An aspect in which the drainage of the treatment liquid is recycled is preferable.

In the aspect of reusing the drainage, the washing step B has the same definition as the washing step B described in the above-mentioned aspect, and a preferred aspect thereof is also the same. Also, in the aspect of reusing the drainage, the method preferably has the ion removing step F, the ion removing step G, the coarse particle removing step H, the charge eliminating step I, and the charge eliminating step J described in the above-mentioned aspect. In addition, the method may have the treatment liquid preparing step A described in the above-mentioned aspect before the washing step B.

The washing step D in which the washing of the substrate is performed using the recovered drainage of the treatment liquid has the same definition as the washing step B in the above-mentioned aspect, and a preferred aspect thereof is also the same.

A drainage recovering means in the drainage recovering steps C and E is not particularly limited. The recovered drainage is preferably stored in the above-mentioned resin-made container in the charge eliminating step J, and the same charge eliminating step as the charge eliminating step J may be performed at this time. In addition, a step in which the recovered drainage is subjected to filtering or the like to remove impurities may be provided.

The treatment liquid (recovered drainage) used can be reused. For example, after performing the washing after applying the treatment liquid of the housing container onto the wafer, the drainage may be recovered and returned to the housing container, or the drainage may be housed in another container and then re-applied to the wafer. A method in which the treatment liquid is circulated and reused may also be used. In a case of circulating the treatment liquid, the washing treatment can be repeated and performed. In the method in which the treatment liquid is circulated and reused, the circulating time of the treatment liquid is not particularly limited, but it is preferable that the treatment liquid is exchanged within one week. It is more preferable that the treatment liquid is exchanged within 3 days, and it is particularly preferable that the treatment liquid is daily exchanged with a new one. In addition, in a case where the treatment liquid is alkaline and has a property of absorbing carbon dioxide, the treatment liquid may be used in an air-tight system or under a nitrogen flow, and it is more preferable that the treatment liquid is used under a nitrogen flow.

[Method for Removing Resist]

The method for removing a resist of the embodiment of the present invention has a step of removing a resist which is at least one of a resist film or a residue of the resist film using the above-mentioned treatment liquid (hereinafter also referred to as a "resist removing step"). In the present invention, "removal of a resist" means "removing" a resist from a substrate having the resist provided thereon, or the like, and encompasses "removal of a resist by peeling", "removal of a resist by dissolution", or the like.

The resist film is provided, for example, at a position corresponding to the metal hard mask 5 contained in the laminate 10 of FIG. 1 as described above. That is, the resist film is provided on the substrate 1, instead of the metal hard mask 5.

The method for removing a resist of the embodiment of the present invention may be used for the removal of the resist film formed as above, and may also be used for the removal of the generated residues (also including by-products) by subjecting the resist film to etching (dry etching such as plasma etching) and/or ashing (dry ashing such as plasma ashing), or the like.

(Resist)

In the removal of the resist using the treatment liquid of the embodiment of the present invention, the resist film to be treated is not particularly limited, but examples thereof include a positive tone photoresist, a negative tone photoresist, and a combined positive-negative tone photoresist.

Specific examples of the positive tone resist include a (meth)acrylate-based resin, a vinyl cinnamate-based resin, a cyclized polyisobutylene-based resin, an azo-novolac-based resin, a diazoketone-novolac-based resin, and at least one resin of a novolac-based resin or a polyhydroxystyrene-based resin.

Specific examples of the negative tone resist include an azido-cyclized polyisoprene-based resin, an azido-phenolic resin, and a chloromethyl polystyrene-based resin. Furthermore, specific examples of the combined positive-negative tone resist include a poly(p-butoxycarbonyloxystyrene)-based resin.

With reference to other examples of the resist for patterning, reference can be made to those disclosed in each of the publications of JP5222804B, JP5244740B, JP5244933B, JP5286236B, JP5210755B, JP5277128B, JP5303604B, JP5216892B, JP5531139B, JP5531078B, and JP5155803B, the contents of which are hereby incorporated by reference.

(Resist Removing Step)

The resist removing step is carried out by bringing the treatment liquid into contact with the resist. This method is not particularly limited, but examples thereof include a method in which a laminate having a resist is immersed in a treatment liquid contained in a tank, a method in which a treatment liquid is sprayed onto a resist, a method in which a treatment liquid is flowed onto a resist, or any combinations thereof. From the viewpoint that resist removing capability is further improved, the method in which a laminate having a resist is immersed in a treatment liquid is preferable.

The temperature of the treatment liquid in the resist removing step is preferably 90° C. or lower, more preferably 20° C. to 70° C., and still more preferably 23° C. to 60° C.

A resist removing duration (a duration for which a resist and a treatment liquid are in contact with each other in the resist removing step) can be adjusted depending on a removing time used, the temperature of the treatment liquid, or the like, and is usually 15 seconds to 60 minutes, and preferably 20 seconds to 30 minutes.

In order to further enhancing the resist removing capability of the treatment liquid, a mechanical stirring method may be used. The mechanical stirring method is as described above in the section of the above-mentioned substrate washing method, and therefore, a description thereof is omitted.

The method for removing a resist of the embodiment of the present invention may have a drying step in which members constituting a semiconductor device, such as a substrate having a resist provided thereon, are dried after the resist removing step.

The drying method is not particularly limited, and examples thereof include the same method as that of the drying step B3 in the above-mentioned method for washing a substrate, and therefore, a description thereof is omitted.

EXAMPLES

Hereinbelow, the present invention will be described in detail with reference to Examples, but the present invention is not limited thereto. Further, "%" and "ppt" are based on mass unless otherwise specified.

[Preparation of Treatment Liquid]

In the preparation of each of the treatment liquids of Examples and Comparative Examples, the respective components are subjected to purification which will be described later, and then used for the preparation of the treatment liquid.

The respective components shown in Table 1 were mixed and stirred to obtain a mixed liquid, and then at least one of a filtering treatment or a filtration treatment of the mixed liquid was performed to obtain each of the treatment liquids of Examples and Comparative Examples. Further, the number of times of each treatment was modified as appropriate such that the contents of Ca, Fe, and Na included in the treatment liquid of each of Examples and Comparative Examples became the contents as described in Table 1, and then the treatment was performed.

Here, as the filter in the filtering treatment, "PE-KLEEN" (trade name) manufactured by Pall Corporation, and "Rinsegard HP/HPX" (trade name) manufactured by Entegris Inc. were used singly or in combination thereof. Further, in the filtering treatment, one-pass or circulation filtering was performed such that the content of each of the specific metal elements became the value in Table 1. Incidentally, the circulation filtering was performed for 1 hour or more.

The components used for the preparation of each of the treatment liquids of Examples and Comparative Examples are as follows.

<Organic Alkali Compound>

TMAH: Tetramethylammonium hydroxide (manufactured by SACHEM, Inc.)

TEAH: Tetraethylammonium hydroxide (manufactured by SACHEM, Inc.)

TBAH: Tetrabutylammonium hydroxide (manufactured by SACHEM, Inc.)

COH: Cholinehydroxide (manufactured by Wako Pure Chemical Industries, Ltd.)

AH-212: Dimethylbis(2-hydroxyethyl)ammonium hydroxide (manufactured by Yokkaichi Chemical Co., Ltd.)

ETMAH: Ethyltrimethylammonium hydroxide (manufactured by SACHEM, Inc.)

MEA: Monoethanolamine (manufactured by Wako Pure Chemical Industries, Ltd.)

AEE: 2-Amino-2-ethoxy-ethanol (manufactured by Wako Pure Chemical Industries, Ltd.)

The organic alkali compound was purified by repetition of filtering through a filter, in addition to adsorption purification using silicon carbide described in WO2012/043496A.

<Organic Solvent>

DMSO: Dimethyl sulfoxide (manufactured by Wako Pure Chemical Industries, Ltd.)

DPGME: Dipropylene glycol monomethyl ether (manufactured by Wako Pure Chemical Industries, Ltd.)

DEGEE: Diethylene glycol monoethyl ether (manufactured by Wako Pure Chemical Industries, Ltd.)

DEGBE: Diethylene glycol monobutyl ether (manufactured by Wako Pure Chemical Industries, Ltd.)

PG: Propylene glycol (manufactured by Wako Pure Chemical Industries, Ltd.)

The organic solvent was purified by being repeatedly subjected to distillation in a distillation column formed with glass, and then by being repeatedly subjected to ion exchange and filtering through a filter.

<Water>

Water was purified by the method described in JP2007-254168A, and used for the preparation of a treatment liquid after confirming that each of the contents of Ca, Fe, and Na included in water was 0.1 ppt by mass to 10 ppt by mass.

<Corrosion Inhibitor>

5-MBTA: 5-Methyl-1H-benzotriazole (manufactured by Wako Pure Chemical Industries, Ltd.)

BTA: Benzotriazole (manufactured by Wako Pure Chemical Industries, Ltd.)

123TZ: 1H-1,2,3-Triazole (manufactured by Wako Pure Chemical Industries, Ltd.)

Catechol (manufactured by Wako Pure Chemical Industries, Ltd.)

Gallic acid (manufactured by Wako Pure Chemical Industries, Ltd.)

2-MBT: 2-Mercaptobenzothiazole (manufactured by Wako Pure Chemical Industries, Ltd.)

IRGAMET 42: 2,2'-{[(4-Methyl-1H-benzotriazol-1-yl)methyl]imino}bisethanol (manufactured by BASF)

IRGAMET 39: N,N-Bis(2-ethylhexyl)-(4 or 5)-methyl-1H-benzotriazole-1-methylamine (manufactured by BASF)

Thioglycerol: 1-Thioglycerol (manufactured by Wako Pure Chemical Industries, Ltd.)

<Other Components>

(Halogen Acid)

HF: Hydrogen Fluoride (manufactured by Kanto Chemical Co., Inc.)

HCl: Hydrogen Chloride (manufactured by Wako Pure Chemical Industries, Ltd.)

HBr: Hydrogen bromide (manufactured by Wako Pure Chemical Industries, Ltd.)

(pH Adjuster)

Citric acid (manufactured by Wako Pure Chemical Industries, Ltd.)

[Measurement of Content]

<Measurement of Content of Specific Metal Elements>

Using the treatment liquids of Examples and Comparative Examples, the respective contents of the specific metal elements (Ca, Fe, and Na) in the treatment liquid were measured. Specifically, using each of the treatment liquids of Examples and Comparative Examples, the measurement was performed by an ICP-MS method using NexION350S (trade name, manufactured by Perkin Elmer, Inc.). The measurement results are shown in Table 1.

Specific measurement conditions for the ICP-MS method is as follows. Incidentally, the detected amount at a peak intensity for a standard solution at a known concentration was measured and converted in terms of the mass of the specific metal elements to calculate the content (total metal content) of the specific metal elements in the treatment liquid used in the measurement.

The content of the specific metal elements was measured by a common ICP-MS method. Specifically, a software for ICP-MS was used as a software used for the analysis of the specific metal elements.

Furthermore, the measurements were all performed in a clean room at a level satisfying ISO Class 2 or less.

(Measurement Conditions for ICP-MS Method)

((Standard Substance))

Ultrapure water was metered into a clean glass container, and metal particles to be measured, having a median diameter of 50 nm, were added thereto such that the concentration became 10,000 particles/ml. Then, a dispersion liquid which had been treated with an ultrasonic washing machine for 30 minutes was used as a standard substance for measurement of a transport efficiency.

((ICP-MS Device Used))

Manufacturer: Perkin Elmer, Inc.

Model: NexION350S ((Measurement Condition for ICP-MS))

A liquid to be measured was aspirated at about 0.2 mL/min using a PFA-made coaxial nebulizer, a quartz-made cyclonic spray chamber, and a quartz-made torch injector with an inner diameter of 1 mm for ICP-MS. Cell purge was performed with an amount of oxygen to be added of 0.1 L/min, a plasma output of 1,600 W, and ammonia gas. Analysis was performed at a time resolution of 50 μs.

((Software))

The content of the specific metal elements was measured using the following analysis software belonging to the manufacturer.

Syngistix for ICP-MS Software

[Physical Properties of Treatment Liquid]

<pH>

The pH of each of the treatment liquids of Examples and Comparative Examples at 23° C. was measured using a pH meter (trade name "pH Meter F-51" manufactured by HORIBA Ltd.).

<Viscosity Ratio>

Using each of the treatment liquids of Examples and Comparative Examples, a viscosity A (at a rotation speed of a rotor of 1,000 rpm) at 23° C. and a viscosity B (at a rotation speed of a rotor of 100 rpm) at 23° C. were measured, and a viscosity ratio (viscosity B/viscosity A) from the obtained values was calculated. For the measurement of the viscosity, a viscometer "DV-E" (trade name, manufactured by Brookfield) was used.

[Evaluation Test]

<Anticorrosion Properties (Corrosion Resistance)>

A film formed of Co (hereinafter also referred to as a "Co film") was prepared, and evaluated on the anticorrosion properties, based on the etching rates thereof. The film thickness of the Co film is 1,000 Å. In a case where the etching rate is low, it can be said that the anticorrosion properties are excellent and in a case where the etching rate is high, the anticorrosion properties are deteriorated.

Using each of the treatment liquids of Examples and Comparative Examples, the Co film was subjected to an etching treatment. Specifically, the Co film was immersed in each of the treatment liquids of Examples and Comparative Examples for 10 minutes, and the etching rate (Å/min) was calculated, based on a difference in the film thickness of the Co film between before and after the immersion in the treatment liquid.

Furthermore, the film thickness of the Co film before and after the treatment was measured using ellipsometry (spectroscopic ellipsometer, trade name "Vase", manufactured by J. A. Woollam Co.) under the conditions of a measuring range of 250 to 1,000 nm and measuring angles of 70 degrees and 75 degrees.

<Residue Removing Capability>

A laminate (corresponding to a laminate before the treatment) comprising a Co film, a SiN film, a $SiO_2$ film, and a metal hard mask (TiN) having a predetermined aperture in this order was formed on a substrate (Si). Using the obtained laminate, plasma etching was carried out with the metal hard mask as a mask, etching of the SiN film and the $SiO_2$ film was performed until the surface of the Co film was exposed to form holes, thereby producing a sample 1 (see FIG. 1). As the cross-section of the laminate was checked with a scanning electron micrograph (SEM: Scanning Electron Microscope), plasma etching residues were observed on the surface of a hole wall.

In addition, according to the following procedure, the residue removing capability was evaluated. First, a workpiece (about 2.0 cm×2.0 cm) of the prepared sample 1 was immersed in each of the treatment liquids controlled at 60° C., and the workpiece of the sample 1 was taken out after 10 minutes, immediately washed with ultrapure water, and dried under $N_2$. Thereafter, the workpiece surface of the sample 1 after immersion was observed by SEM, and the removing capability of the plasma etching residue ("residue removing capability") was evaluated in accordance with the following evaluation standard.

"AA": The plasma etching residues were completely removed within 5 minutes.
"A": The plasma etching residues were completely removed after 5 minutes and within 8 minutes.
"B": The plasma etching residues were completely removed after 8 minutes and within 10 minutes.
"C": The plasma etching residues were not completely removed at a point after 10 minutes, but there is no problem in the performance.
"D": The removal of the plasma etching residues was insufficient at a point after 10 minutes, and an influence on the performance is generated.

<Resist Removing Capability>

A sample 2 having a resist film formed on a Si substrate was obtained with reference to paragraph 0030 of JP2012-194536A. A workpiece (about 2.0 cm×2.0 cm) of the sample 2 was immersed in each of the treatment liquids controlled at 60° C., and the workpiece of the sample 2 was taken out after 10 minutes, immediately washed with ultrapure water, and dried under $N_2$. Thereafter, the workpiece surface of the sample 2 after immersion was observed with the naked eye and evaluated in accordance with the following evaluation standard.

"AA": The resist was completely removed within 5 minutes.
"A": The resist was completely removed after 5 minutes and within 8 minutes.
"B": The resist was completely removed after 8 minutes and within 10 minutes.
"C": The resist was not completely removed at a point after 10 minutes, but there is no problem in the performance.
"D": The removal of the resist was insufficient at a point after 10 minutes, and an influence on the performance is generated.

<Defect Performance>

The number of foreign matters with a diameter of 32 nm or more present on the surface of the silicon substrate with a diameter of 300 mm, and the address of each of the foreign matters were measured using a wafer surface inspection device (SP-5, manufactured by KLA-Tencor Corporation).

Furthermore, a wafer for which the number of foreign matters present on the surface of the silicon substrate had been counted was set up in a spinning wafer treatment device (manufactured by EKC Technology, Inc.).

Next, each of the treatment liquids of Examples and Comparative Examples was jetted onto the surface of the set wafer for 1 minute at a flow rate of 1.5 L/min. Thereafter, the wafer was spin-dried.

For the obtained wafer after drying, the number of the foreign matters on the wafer and the addresses of the foreign matters were measured using the wafer surface inspection device.

In addition, for the newly increased foreign matters after spin-drying the treatment liquid, elemental analysis by energy dispersive X-ray (EDX) spectrometry was performed using a defect analyzer (SEM VISION G6, manufactured by APPLIED MATERIALS, Inc.). The foreign matters including specific metal elements of Ca, Fe, and Na were counted as particles. The number of the particles thus obtained was evaluated in accordance with the following evaluation standard. The results are shown in Table 1.

"A": The number of particles with a diameter of 32 nm or more containing the specific metal elements is 0 or more and less than 100.
"B": The number of particles with a diameter of 32 nm or more containing the specific metal elements is 100 or more and less than 500.
"C": The number of particles with a diameter of 32 nm or more containing the specific metal elements is 500 or more and less than 1,000.
"D": The number of particles with a diameter of 32 nm or more containing the specific metal elements is 1,000 or more.

[Evaluation Results]

The above evaluation results are shown in Table 1 below. In addition, the numerical values on the right side as in "10^(−9)" in the tables mean exponents, and specifically "10^(−9)" means "$10^{-9}$".

TABLE 1

| | Composition of treatment liquid | | | | | pH of treatment liquid | Ca (ppt) | Fe (ppt) | Na (ppt) |
| --- | --- | --- | --- | --- | --- | --- | --- | --- | --- |
| | Organic alkali compound | Organic solvent | Water | Corrosion inhibitor | Others | | | | |
| Example 1 | TMAH 1.0% | DMSO 78.0% | Balance | 5-MBTA 1.0% | | 14 | 10 | 1 | 8 |
| Example 2 | TMAH 1.0% | DMSO 78.0% | Balance | 5-MBTA 1.0% | | 14 | 10^3 | 10^2 | 10^3 |
| Example 3 | TMAH 1.0% | DMSO 78.0% | Balance | 5-MBTA 1.0% | | 14 | 10^6 | 10^5 | 10^6 |
| Example 4 | TMAH 1.0% | DMSO 58.0% | Balance | 5-MBTA 1.0% | | 14 | 11 | 1 | 10 |
| Example 5 | TMAH 1.0% | DMSO 20.0% | Balance | 5-MBTA 1.0% | | 14 | 10 | 1 | 10 |
| Example 6 | TMAH 1.0% | DMSO 88.0% | Balance | 5-MBTA 1.0% | | 14 | 10 | 1 | 10 |
| Example 7 | TMAH 1.0% | DMSO 97.0% | Balance | 5-MBTA 1.0% | | 14 | 10 | 1 | 10 |
| Example 8 | TMAH 1.0% | DMSO 78.0% | Balance | 5-MBTA 1.0% | Appropriate amount of citric acid | 12 | 10 | 1 | 8 |
| Example 9 | TMAH 1.0% | DMSO 78.0% | Balance | 5-MBTA 1.0% | Appropriate amount of citric acid | 9.5 | 10 | 1 | 8 |
| Example 10 | TMAH 1.0% | DMSO 78.0% | Balance | 5-MBTA 1.0% | Appropriate amount of citric acid | 8 | 10 | 1 | 8 |

TABLE 1-continued

| | | | | | | | | |
|---|---|---|---|---|---|---|---|---|
| Example 11 | TEAH 1.0% | DMSO 78.0% | Balance | 5-MBTA 1.0% | | 14 | 10 | 1 | 8 |
| Example 12 | TBAH 1.0% | DMSO 78.0% | Balance | 5-MBTA 1.0% | | 14 | 10 | 1 | 8 |
| Example 13 | COH 1.0% | DMSO 78.0% | Balance | 5-MBTA 1.0% | | 14 | 10 | 1 | 8 |
| Example 14 | AH-212 1.0% | DMSO 78.0% | Balance | 5-MBTA 1.0% | | 14 | 10 | 1 | 8 |
| Example 15 | ETMAH 1.0% | DMSO 78.0% | Balance | 5-MBTA 1.0% | | 14 | 10 | 1 | 8 |
| Example 16 | MEA 1.0% | DMSO 78.0% | Balance | 5-MBTA 1.0% | | 14 | 10 | 1 | 8 |
| Example 17 | AEE 1.0% | DMSO 78.0% | Balance | 5-MBTA 1.0% | | 14 | 10 | 1 | 8 |
| Example 18 | TMAH 3.0% | DMSO 77.0% | Balance | 5-MBTA 1.0% | HF 1.0% | 14 | 10 | 1 | 8 |
| Example 19 | TMAH 3.0% | DMSO 77.0% | Balance | 5-MBTA 1.0% | HCl 1.0% | 14 | 10 | 1 | 8 |
| Example 20 | TMAH 3.0% | DMSO 77.0% | Balance | 5-MBTA 1.0% | HBr 1.0% | 14 | 10 | 1 | 8 |
| Example 21 | TMAH 1.0% | DMSO 78.0% | Balance | BTA 1.0% | | 14 | 10 | 1 | 8 |
| Example 22 | TMAH 1.0% | DMSO 78.0% | Balance | 123TZ 1.0% | | 14 | 10 | 1 | 8 |
| Example 23 | TMAH 1.0% | DMSO 78.0% | Balance | Catechol 1.0% | | 14 | 10 | 1 | 8 |
| Example 24 | TMAH 1.0% | DMSO 78.0% | Balance | Thioglycerol 1.0% | | 14 | 10 | 1 | 8 |
| Example 25 | TMAH 1.0% | DMSO 78.0% | Balance | IRGAMET42 1.0% | | 14 | 10 | 1 | 8 |
| Example 26 | TMAH 10.0% | DPGME 59.0% | Balance | 5-MBTA 1.0% | | 14 | 10 | 1 | 8 |
| Example 27 | TMAH 10.0% | DPGME 59.0% | Balance | IRGAMET42 1.0% | | 14 | 10 | 1 | 8 |
| Example 28 | TMAH 10.0% | DPGME 59.0% | Balance | IRGAMET39 1.0% | | 14 | 10 | 1 | 8 |
| Example 29 | TMAH 10.0% | DEGEE 59.0% | Balance | IRGAMET42 1.0% | | 14 | 10 | 1 | 8 |
| Example 30 | TMAH 10.0% | DEGBE 59.0% | Balance | IRGAMET42 1.0% | | 14 | 10 | 1 | 8 |
| Example 31 | TMAH 10.0% | DEGBE 58.0% | Balance | IRGAMET42 1.0% Thioglycerol 1.0% | | 14 | 10 | 1 | 8 |
| Example 32 | TMAH 10.0% | DMSO 25% PG 15% DEGBE 18% | Balance | IRGAMET42 1.0% Thioglycerol 1.0% | | 14 | 10 | 1 | 8 |
| Example 33 | TMAH 10.0% | DMSO 25% PG 18% DEGBE 15% | Balance | IRGAMET42 1.0% Thioglycerol 1.0% | | 14 | 10 | 1 | 8 |
| Comparative Example 1 | TMAH 1.0% | DMSO 79.0% | Balance | | | 14 | 10 | 1 | 8 |
| Comparative Example 2 | TMAH 1.0% | DMSO 79.0% | Balance | | | 14 | 10^−3 | 1 | 8 |
| Comparative Example 3 | TMAH 1.0% | DMSO 78.0% | Balance | 5-MBTA 1.0% | | 14 | 10^8 | 10^7 | 10^8 |
| Comparative Example 4 | TMAH 1.0% | DMSO 78.0% | Balance | 5-MBTA 1.0% | | 14 | 10^8 | 10^9 | 10^8 |

| | Content ratio of each metal element to organic alkali compound | | | Content ratio of each metal element to corrosion inhibitor | | | Viscosity ratio (100 rpm/ 1,000 rpm) |
|---|---|---|---|---|---|---|---|
| | Ca | Fe | Na | Ca | Fe | Na | |
| Example 1 | 10^(−9) | 10^(−10) | 8 × 10^(−10) | 10^(−9) | 10^(−10) | 8 × 10^(−10) | 1 |
| Example 2 | 10^(−7) | 10^(−8) | 10^(−7) | 10^(−7) | 10^(−8) | 10^(−7) | 1 |
| Example 3 | 10^(−4) | 10^(−5) | 10^(−4) | 10^(−4) | 10^(−5) | 10^(−4) | 1 |
| Example 4 | 1.1 × 10^(−9) | 10^(−10) | 10^(−9) | 1.1 × 10^(−9) | 10^(−10) | 10^(−9) | 1.5 |
| Example 5 | 10^(−9) | 10^(−10) | 10^(−9) | 10^(−9) | 10^(−10) | 10^(−9) | 2.5 |
| Example 6 | 10^(−9) | 10^(−10) | 10^(−9) | 10^(−9) | 10^(−10) | 10^(−9) | 1 |
| Example 7 | 10^(−9) | 10^(−10) | 10^(−9) | 10^(−9) | 10^(−10) | 10^(−9) | 1 |

TABLE 1-continued

| | | | | | | | |
|---|---|---|---|---|---|---|---|
| Example 8 | 10^(−9) | 10^(−10) | 8 × 10^(−10) | 10^(−9) | 10^(−10) | 8 × 10^(−10) | 1 |
| Example 9 | 10^(−9) | 10^(−10) | 8 × 10^(−10) | 10^(−9) | 10^(−10) | 8 × 10^(−10) | 1 |
| Example 10 | 10^(−9) | 10^(−10) | 8 × 10^(−10) | 10^(−9) | 10^(−10) | 8 × 10^(−10) | 1 |
| Example 11 | 10^(−9) | 10^(−10) | 8 × 10^(−10) | 10^(−9) | 10^(−10) | 8 × 10^(−10) | 1 |
| Example 12 | 10^(−9) | 10^(−10) | 8 × 10^(−10) | 10^(−9) | 10^(−10) | 8 × 10^(−10) | 1 |
| Example 13 | 10^(−9) | 10^(−10) | 8 × 10^(−10) | 10^(−9) | 10^(−10) | 8 × 10^(−10) | 1 |
| Example 14 | 10^(−9) | 10^(−10) | 8 × 10^(−10) | 10^(−9) | 10^(−10) | 8 × 10^(−10) | 1 |
| Example 15 | 10^(−9) | 10^(−10) | 8 × 10^(−10) | 10^(−9) | 10^(−10) | 8 × 10^(−10) | 1 |
| Example 16 | 10^(−9) | 10^(−10) | 8 × 10^(−10) | 10^(−9) | 10^(−10) | 8 × 10^(−10) | 1 |
| Example 17 | 10^(−9) | 10^(−10) | 8 × 10^(−10) | 10^(−9) | 10^(−10) | 8 × 10^(−10) | 1 |
| Example 18 | 0.3 × 10^(−9) | 0.3 × 10^(−10) | 2.7 × 10^(−10) | 10^(−9) | 10^(−10) | 8 × 10^(−10) | 1 |
| Example 19 | 0.3 × 10^(−9) | 0.3 × 10^(−10) | 2.7 × 10^(−10) | 10^(−9) | 10^(−10) | 8 × 10^(−10) | 1 |
| Example 20 | 0.3 × 10^(−9) | 0.3 × 10^(−10) | 2.7 × 10^(−10) | 10^(−9) | 10^(−10) | 8 × 10^(−10) | 1 |
| Example 21 | 10^(−9) | 10^(−10) | 8 × 10^(−10) | 10^(−9) | 10^(−10) | 8 × 10^(−10) | 1 |
| Example 22 | 10^(−9) | 10^(−10) | 8 × 10^(−10) | 10^(−9) | 10^(−10) | 8 × 10^(−10) | 1 |
| Example 23 | 10^(−9) | 10^(−10) | 8 × 10^(−10) | 10^(−9) | 10^(−10) | 8 × 10^(−10) | 1 |
| Example 24 | 10^(−9) | 10^(−10) | 8 × 10^(−10) | 10^(−9) | 10^(−10) | 8 × 10^(−10) | 1 |
| Example 25 | 10^(−9) | 10^(−10) | 8 × 10^(−10) | 10^(−9) | 10^(−10) | 8 × 10^(−10) | 1 |
| Example 26 | 10^(−10) | 10^(−11) | 0.8 × 10^(−10) | 10^(−9) | 10^(−10) | 8 × 10^(−10) | 1 |
| Example 27 | 10^(−10) | 10^(−11) | 0.8 × 10^(−10) | 10^(−9) | 10^(−10) | 8 × 10^(−10) | 1 |
| Example 28 | 10^(−10) | 10^(−11) | 0.8 × 10^(−10) | 10^(−9) | 10^(−10) | 8 × 10^(−10) | 1 |
| Example 29 | 10^(−10) | 10^(−11) | 0.8 × 10^(−10) | 10^(−9) | 10^(−10) | 8 × 10^(−10) | 1 |
| Example 30 | 10^(−10) | 10^(−11) | 0.8 × 10^(−10) | 10^(−9) | 10^(−10) | 8 × 10^(−10) | 1 |
| Example 31 | 10^(−10) | 10^(−11) | 0.8 × 10^(−10) | 5 × 10^(−10) | 0.5 × 10^(−10) | 4 × 10^(−10) | 1 |
| Example 32 | 10^(−10) | 10^(−11) | 0.8 × 10^(−10) | 5 × 10^(−10) | 0.5 × 10^(−10) | 4 × 10^(−10) | 1 |
| Example 33 | 10^(−10) | 10^(−11) | 0.8 × 10^(−10) | 5 × 10^(−10) | 0.5 × 10^(−10) | 4 × 10^(−10) | 1 |
| Comparative Example 1 | 10^(−9) | 10^(−10) | 8 × 10^(−10) | — | — | — | 1 |
| Comparative Example 2 | 10^(−13) | 10^(−10) | 8 × 10^(−10) | — | — | — | 1 |
| Comparative Example 3 | 10^(−2) | 10^(−3) | 10^(−2) | 10^(−2) | 10^(−3) | 10^(−2) | 1 |
| Comparative Example 4 | 10^(−2) | 10^(−1) | 10^(−2) | 10^(−2) | 10^(−1) | 10^(−2) | 1 |

| | Evaluation results | | | |
|---|---|---|---|---|
| | Corrosion resistance (Å/min) | Residue removing capability | Resist removing capability | Defect performance |
| Example 1 | 12 | A | A | A |
| Example 2 | 4 | B | B | B |
| Example 3 | 1 | B | B | C |
| Example 4 | 18 | B | B | A |
| Example 5 | 35 | C | C | A |
| Example 6 | 8 | A | A | A |
| Example 7 | 6 | A | A | A |
| Example 8 | 32 | A | A | A |
| Example 9 | 41 | B | B | A |
| Example 10 | 48 | B | B | A |
| Example 11 | 8 | A | A | A |
| Example 12 | 7 | A | A | A |
| Example 13 | 6 | A | A | A |
| Example 14 | 9 | A | A | A |
| Example 15 | 12 | A | A | A |
| Example 16 | 8 | A | A | A |
| Example 17 | 9 | A | A | A |
| Example 18 | 10 | AA | AA | A |
| Example 19 | 10 | AA | AA | A |
| Example 20 | 10 | AA | AA | A |
| Example 21 | 5 | A | A | A |
| Example 22 | 4 | A | A | A |
| Example 23 | 5 | A | A | A |
| Example 24 | 3 | A | A | A |
| Example 25 | 2 | A | A | A |
| Example 26 | 12 | A | A | A |
| Example 27 | 13 | A | A | A |
| Example 28 | 8 | A | A | A |
| Example 29 | 15 | A | A | A |

TABLE 1-continued

| | | | | |
|---|---|---|---|---|
| Example 30 | 4 | A | A | A |
| Example 31 | 1 | A | A | A |
| Example 32 | 2 | AA | AA | A |
| Example 33 | 1 | AA | AA | A |
| Comparative Example 1 | 51 | A | A | A |
| Comparative Example 2 | 62 | A | A | D |
| Comparative Example 3 | 6 | C | C | D |
| Comparative Example 4 | 2 | D | D | D |

As seen from the results shown in Table 1, it was shown that generation of defects can be reduced, the anticorrosion properties for a metal layer included in a semiconductor device was excellent, and the removing capability for a resist used during the manufacture of a semiconductor device was also excellent by adjusting each of the mass ratio of the Ca, the mass ratio of the Fe, and the mass ratio of the Na with respect to the organic alkali compound in the treatment liquid to $10^{-12}$ to $10^{-4}$ (Examples). Incidentally, it was also shown that by the treatment liquids of Examples, the removing capability for etching residues was also excellent.

On the other hand, it was shown that in a case where the treatment liquid did not contain a corrosion inhibitor, the anticorrosion properties for the metal layer was deteriorated (Comparative Examples 1 and 2).

Furthermore, it was shown that in a case where at least one mass ratio of the mass ratio of the Ca, the mass ratio of the Fe, or the mass ratio of the Na with respect to the organic alkali compound was less than $10^{-12}$, generation of defects became noticeable (Comparative Example 2).

In addition, it was shown that in a case where at least one mass ratio of the mass ratio of the Ca, the mass ratio of the Fe, or the mass ratio of the Na with respect to the organic alkali compound was more than $10^{-4}$, generation of defects became noticeable (Comparative Examples 3 and 4).

<Charge Eliminating Test and Evaluation Results>

For the treatment liquid of Example 6, the above-mentioned respective evaluation tests were performed in the same manner except that charge elimination was performed with a material SUS316 grounded and the immersion time was set to 20 minutes.

As a result of the evaluations with any of the treatment liquids, in any of the case where the charge eliminating step had been performed and the case where the charge eliminating step had not been performed, and thus, the residue removing performance and the resist removing performance were not changed. In the evaluation of the anticorrosion properties and the defect performance, results with more excellent anticorrosion properties and defect performance were obtained in the case where the charge eliminating step had been performed.

From these results, it was found that the anticorrosion properties and the defect performance were more excellent by performing the charge eliminating step.

<Recycling Test and Evaluation Results>

For each of the treatment liquids of Example 6, each of the treatments in each of the evaluation tests was consecutively performed 25 times, using the same treatment liquid. Thereafter, the recovered liquid was returned to the tank, and the liquid was subjected to the evaluation again (that is, 25 sheets of objects to be treated were consecutively treated while not changing the treatment liquid, and the 26$^{th}$ sheet of the object to be treated was subjected to the above-mentioned evaluations to evaluate various performances).

As a result of the evaluations, it was found that in both of the case where the recycling test was performed and the case where the recycling test was not performed, there was no change in various evaluation results. From this result, it was found that the treatment liquid of the embodiment of the present invention can be used substantially without a change in the performance also in the case where the substrate was repeatedly treated with the treatment liquid, and thus, has excellent recyclability.

EXPLANATION OF REFERENCES

1 substrate
2 metal film
3 etching stop layer
4 interlayer insulating film
5 metal hard mask
6 hole
10 laminate
11 inner wall
11a cross-sectional wall
11b bottom wall
12 dry etching residue

What is claimed is:

1. A treatment liquid for a semiconductor device, comprising:
    an organic alkali compound;
    a corrosion inhibitor;
    an organic solvent;
    Ca;
    Fe; and
    Na,
    wherein each of the content of Ca, Fe, and Na with respect to the total mass of the treatment liquid is 0.1 ppb by mass to 10 ppb by mass,
    each of the mass ratio of Ca, Fe, and Na with respect to the organic alkali compound in the treatment liquid is $10^{-12}$ to $10^{-4}$,
    each of the mass ratio of Ca, Fe, and Na with respect to the corrosion inhibitor in the treatment liquid is $10^{-12}$ to $10^{-4}$,
    in a case where the viscosity of the treatment liquid at room temperature is measured using a rotational viscometer, the ratio of the viscosity of the treatment liquid at a rotation speed of 100 rpm with respect to the viscosity of the treatment liquid at a rotation speed of 1,000 rpm is 1 to 20, and
    the organic solvent includes an alkylene glycol.

2. The treatment liquid according to claim 1, further comprising water, wherein the content of the water with respect to the total mass of the treatment liquid is 20% to 98% by mass, and the content of the organic solvent with respect to the total mass of the treatment liquid is 1% to 40% by mass.

3. The treatment liquid according to claim 1, further comprising water, wherein the content of the water with respect to the total mass of the treatment liquid is 1% to 40% by mass, and the content of the organic solvent with respect to the total mass of the treatment liquid is 20% to 98% by mass.

4. The treatment liquid according to claim 1, further comprising halogen acid.

5. The treatment liquid according to claim 1, wherein the pH of the treatment liquid is more than 9 and less than 15.

6. The treatment liquid according to claim 1, wherein the organic alkali compound includes at least one compound selected from the group consisting of a compound represented by Formula (1) and a compound represented by Formula (2),

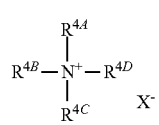
(1)

in Formula (1), $R^{4A}$ to $R^{4D}$ each independently represent an alkyl group having 1 to 6 carbon atoms, a hydroxyalkyl group having 1 to 6 carbon atoms, a benzyl group, or an aryl group, and $X^-$ represents a counter anion,

Formula (2)

in Formula (2), $R^1$ and $R^2$ each independently represent a hydrogen atom, a methyl group, an ethyl group, or a hydroxyethyl group, and $R^3$'s each independently represent a hydrogen atom or a hydroxyethyl group, provided that in Formula (2), at least one alkanol group is included.

7. The treatment liquid according to claim 1, wherein the semiconductor device has a substrate including a metal layer containing Co, and the treatment liquid is used for the treatment to the metal layer.

8. The treatment liquid according to claim 1, wherein a resist film is formed during the manufacture of the semiconductor device, and the treatment liquid is used for the removal of a resist which is at least one of the resist film or a residue of the resist film.

9. The treatment liquid according to claim 1, wherein the corrosion inhibitor includes at least one compound selected from the group consisting of a compound represented by Formula (A), a compound represented by Formula (B), a compound represented by Formula (C), and a substituted or unsubstituted tetrazole,

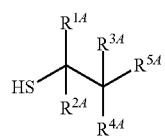
(A)

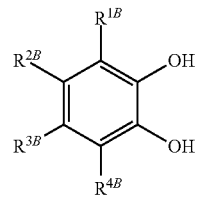
(B)

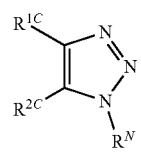
(C)

in Formula (A), $R^{1A}$ to $R^{5A}$ each independently represent a hydrogen atom, a substituted or unsubstituted hydrocarbon group, a hydroxyl group, a carboxyl group, or a substituted or unsubstituted amino group, provided that at least one group selected from the group consisting of the hydroxyl group, the carboxyl group, or the substituted and unsubstituted amino group is included in the structure, in Formula (B), $R^{1B}$ to $R^{4B}$ each independently represent a hydrogen atom or a substituted or unsubstituted hydrocarbon group, and in Formula (C), $R^{1C}$, $R^{2C}$, and $R^N$ each independently represent a hydrogen atom or a substituted or unsubstituted hydrocarbon group, and $R^{1C}$ and $R^{2C}$ may be bonded to each other to form a ring.

10. A method for washing a substrate, comprising a washing step B in which a substrate including a metal layer containing Co is washed using the treatment liquid according to claim 1.

11. The method for washing a substrate according to claim 10, further comprising:

a drainage recovering step C in which drainage of the treatment liquid used in the washing step B is recovered;

a washing step D in which a newly prepared substrate including a metal layer containing Co is washed with the recovered drainage of the treatment liquid;

a drainage recovering step E in which drainage of the treatment liquid used in the washing step D is recovered; and a step in which the washing step D and the drainage recovering step E are repeated.

12. The method for washing a substrate according to claim 10, further comprising:

a treatment liquid preparing step A in which the treatment liquid is prepared before the washing step B; and an ion removing step F in which Ca ions, Fe ions, and Na ions are removed from at least one of the organic alkali compound, the corrosion inhibitor, or the organic solvent before the treatment liquid preparing step A, or an ion removing step G in which Ca ions, Fe ions, and Na ions in the treatment liquid are removed before performing the washing step B and after the treatment liquid preparing step A.

13. The method for washing a substrate according to claim 12, wherein the treatment liquid preparing step A is to prepare the treatment liquid using water, and the ion removing step F is to remove Ca ions, Fe ions, and Na ions from at least one of the organic alkali compound, the corrosion inhibitor, the organic solvent, or the water.

14. The method for washing a substrate according to claim 10, further comprising:
a treatment liquid preparing step A in which the treatment liquid is prepared using water before the washing step B; and
a neutralization step I in which the water is subjected to charge elimination before the treatment liquid preparing step A, or a neutralization step J in which the treatment liquid is subjected to charge elimination before performing the washing step B and after the treatment liquid preparing step A.

15. A method for removing a resist, comprising removing a resist which is at least one of a resist film or a residue of the resist film using the treatment liquid according to claim 1.

16. A treatment liquid for a semiconductor device, comprising:
an organic alkali compound;
a corrosion inhibitor;
an organic solvent;
Ca;
Fe; and
Na,
wherein each of the content of Ca, Fe, and Na with respect to the total mass of the treatment liquid is 0.1 ppb by mass to 10 ppb by mass,
each of the mass ratio of Ca, Fe, and Na with respect to the organic alkali compound in the treatment liquid is $10^{-12}$ to $10^{-4}$,
each of the mass ratio of Ca, Fe, and Na with respect to the corrosion inhibitor in the treatment liquid is $10^{-12}$ to $10^{-4}$,
in a case where the viscosity of the treatment liquid at room temperature is measured using a rotational viscometer, the ratio of the viscosity of the treatment liquid at a rotation speed of 100 rpm with respect to the viscosity of the treatment liquid at a rotation speed of 1,000 rpm is 1 to 20,
the organic alkali compound includes an alkanolamine, and
the pH of the treatment liquid is 11 or more.

17. A treatment liquid for a semiconductor device, comprising:
an organic alkali compound;
a corrosion inhibitor;
an organic solvent;
Ca;
Fe; and
Na,
wherein each of the content of Ca, Fe, and Na with respect to the total mass of the treatment liquid is 0.1 ppb by mass to 10 ppb by mass,
each of the mass ratio of Ca, Fe, and Na with respect to the organic alkali compound in the treatment liquid is $10^{-12}$ to $10^{-4}$,
each of the mass ratio of Ca, Fe, and Na with respect to the corrosion inhibitor in the treatment liquid is $10^{-12}$ to $10^{-4}$,
in a case where the viscosity of the treatment liquid at room temperature is measured using a rotational viscometer, the ratio of the viscosity of the treatment liquid at a rotation speed of 100 rpm with respect to the viscosity of the treatment liquid at a rotation speed of 1,000 rpm is 1 to 20,
the organic alkali compound includes an alkanolamine, and
the pH of the treatment liquid is more than 9 and less than 15.

* * * * *